(12) United States Patent
Hemink et al.

(10) Patent No.: US 7,466,590 B2
(45) Date of Patent: Dec. 16, 2008

(54) SELF-BOOSTING METHOD FOR FLASH MEMORY CELLS

(75) Inventors: Gerrit Jan Hemink, Yokohama (JP); Hironobu Nakao, Mie (JP); Shih-Chung Lee, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/321,955

(22) Filed: Dec. 28, 2005

(65) Prior Publication Data

US 2006/0198195 A1   Sep. 7, 2006

Related U.S. Application Data

(63) Continuation-in-part of application No. 10/774,014, filed on Feb. 6, 2004, now Pat. No. 7,161,833.

(51) Int. Cl.
*G11C 11/34* (2006.01)
(52) U.S. Cl. .............................. 365/185.18; 365/185.17
(58) Field of Classification Search ............ 365/185.18, 365/185.17
See application file for complete search history.

(56) References Cited

U.S. PATENT DOCUMENTS 5,043,940 A   8/1991   Harari (Continued)

FOREIGN PATENT DOCUMENTS

DE   09-082922   3/1997

(Continued)

OTHER PUBLICATIONS

Aritome et al., "Reliability Issues of Flash Memory Cells", Proceedings of the IEEE, New York, vol. 81, No. 5, May 1, 1993, pp. 776-788.

(Continued)

*Primary Examiner*—Michael T Tran
(74) *Attorney, Agent, or Firm*—Davis Wright Tremaine LLP

(57) ABSTRACT

A low voltage (e.g. of the order of or one to three volts) instead of an intermediate $V_{PASS}$ voltage (e.g. of the order of five to ten volts) is applied to word line zero immediately adjacent to the source or drain side select gate of a flash device such as a NAND flash device and one or more additional word lines next to such word line to reduce or prevent the shifting of threshold voltage of the memory cells coupled to word line zero during the programming cycles of the different cells of the NAND strings. This may be implemented in any one of a variety of different self boosting schemes including erased areas self boosting and local self boosting schemes. In a modified erased area self boosting scheme, low voltages are applied to two or more word lines on the source side of the selected word line to reduce band-to-band tunneling and to improve the isolation between two boosted channel regions. In a modified local self boosting scheme, zero volt or low voltages are applied to two or more word lines on the source side and to two or more word lines on the drain side of the selected word line to reduce band-to-band tunneling and to improve the isolation of the channel areas coupled to the selected word line. Different intermediate boosting voltage(s) (e.g. of the order of five to ten volts) may be applied to one or more of the word lines adjacent to the selected word line (that is the word line programming the selected transistor), where the boosting voltage(s) applied to the word line(s) adjacent to the selected word line are/is different from that or those applied to other unselected word lines.

37 Claims, 13 Drawing Sheets

U.S. PATENT DOCUMENTS

| | | | |
|---|---|---|---|
| 5,172,338 | A | 12/1992 | Mehrotra et al. |
| 5,570,315 | A | 10/1996 | Tanaka et al. |
| 5,621,684 | A | 4/1997 | Jung |
| 5,677,873 | A | 10/1997 | Choi et al. |
| 5,715,194 | A | 2/1998 | Hu et al. |
| 5,745,412 | A | 4/1998 | Choi |
| 5,774,397 | A | 6/1998 | Endoh et al. |
| 5,793,677 | A | 8/1998 | Hu et al. |
| 5,887,145 | A | 3/1999 | Harari et al. |
| 5,969,985 | A | 10/1999 | Tanaka et al. |
| 5,991,202 | A | 11/1999 | Derhacobian et al. |
| 6,044,013 | A | 3/2000 | Tanaka et al. |
| 6,046,935 | A | 4/2000 | Takeuchi et al. |
| 6,061,270 | A | 5/2000 | Choi |
| 6,107,658 | A | 8/2000 | Itoh et al. |
| 6,154,391 | A | 11/2000 | Takeuchi et al. |
| 6,191,975 | B1 | 2/2001 | Shimizu et al. |
| 6,282,117 | B1 | 8/2001 | Tanaka et al. |
| 6,295,227 | B1 | 9/2001 | Sakui et al. |
| 6,363,010 | B2 | 3/2002 | Tanaka et al. |
| 6,455,889 | B2 | 9/2002 | Sakui |
| 6,456,528 | B1 | 9/2002 | Chen |
| 6,493,265 | B2 | 12/2002 | Satoh et al. |
| 6,512,262 | B2 | 1/2003 | Watanabe |
| 6,522,580 | B2 | 2/2003 | Chen et al. |
| 6,525,964 | B2 | 2/2003 | Tanaka et al. |
| 6,535,424 | B2 | 3/2003 | Le et al. |
| 6,545,909 | B2 | 4/2003 | Tanaka et al. |
| 6,614,688 | B2 | 9/2003 | Jeong et al. |
| 6,643,188 | B2 | 11/2003 | Tanaka et al. |
| 6,700,815 | B2 | 3/2004 | Le et al. |
| 6,717,838 | B2 | 4/2004 | Hosoi |
| 6,717,861 | B2 | 4/2004 | Jeong et al. |
| 6,804,150 | B2 | 10/2004 | Park et al. |
| 6,859,394 | B2 | 2/2005 | Matsunaga et al. |
| 6,859,395 | B2 | 2/2005 | Matsunaga et al. |
| 6,859,397 | B2 | 2/2005 | Lutze et al. |
| 6,882,577 | B2 | 4/2005 | Chiu et al. |
| 6,898,126 | B1 | 5/2005 | Yang et al. |
| 6,930,921 | B2 | 8/2005 | Matsunaga et al. |
| 6,975,018 | B2 | 12/2005 | Ohmi et al. |
| 6,987,694 | B2 | 1/2006 | Lee |
| 7,088,621 | B2 * | 8/2006 | Guterman et al. ...... 365/185.18 |
| 7,092,294 | B2 | 8/2006 | Sato et al. |
| 7,161,833 | B2 | 1/2007 | Hemink |
| 7,170,973 | B2 | 1/2007 | Gipp et al. |
| 2001/0001491 | A1 | 5/2001 | Sakui |
| 2001/0045585 | A1 | 11/2001 | Watanabe |
| 2002/0110019 | A1 | 8/2002 | Satoh et al. |
| 2002/0118569 | A1 * | 8/2002 | Jeong et al. ............ 365/185.18 |
| 2003/0048662 | A1 * | 3/2003 | Park et al. ............... 365/185.18 |
| 2003/0147278 | A1 | 8/2003 | Tanaka et al. |
| 2004/0080980 | A1 | 4/2004 | Lee |
| 2005/0047210 | A1 | 3/2005 | Matsunaga et al. |
| 2005/0056869 | A1 | 3/2005 | Ichige et al. |
| 2005/0157549 | A1 | 7/2005 | Mokhlesi |
| 2005/0174852 | A1 | 8/2005 | Hemink |
| 2005/0226055 | A1 | 10/2005 | Guterman |
| 2006/0028868 | A1 * | 2/2006 | Okazaki et al. ........ 365/185.05 |
| 2006/0092703 | A1 | 5/2006 | Chae et al. |
| 2006/0133149 | A1 | 6/2006 | Chae et al. |
| 2006/0227613 | A1 * | 10/2006 | Joo ....................... 365/185.18 |
| 2007/0019474 | A1 * | 1/2007 | Kim et al. .............. 365/185.18 |
| 2007/0047314 | A1 * | 3/2007 | Goda et al. ............ 365/185.18 |
| 2007/0081384 | A1 | 4/2007 | Hemink |
| 2007/0236992 | A1 | 10/2007 | Oowada |
| 2007/0236993 | A1 | 10/2007 | Oowada |

FOREIGN PATENT DOCUMENTS

| | | |
|---|---|---|
| DE | 10 2005 057553 A | 10/2006 |
| EP | 0 701 259 A2 | 3/1996 |
| TW | 520507 B | 2/2003 |
| TW | 563136 B | 11/2003 |
| TW | 200306585 | 11/2003 |
| TW | 569221 B | 1/2004 |
| WO | WO 97/49089 | 12/1997 |
| WO | WO 2005/078733 A2 | 8/2005 |
| WO | WO 2006/124525 | 11/2006 |
| WO | WO 2007/078793 | 7/2007 |
| WO | WO 2007/089370 A2 | 8/2007 |
| WO | WO 2007/117869 A2 | 10/2007 |

OTHER PUBLICATIONS

Brown et al., Editors, "Nonvolatile Semiconductor Memory Technology, A Comprehensive Guide to Understanding and Using NVSM Devices", IEEE Press Series on Microelectronic Systems, (1998), 57 pages.

Cho et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, 9 pages.

Choi et al., "A Novel Booster Plate Technology in High Density NAND Flash Memories for Voltage Scaling Down and Zero Program Disturbance", 1996 Symposium on VLSI Technology Digest of Technical Papers, 0-7803-3342-X/96/IEEE, 4 pages.

Jung et al., "A 3.3-V Single Power Supply 16-Mb Nonvolatile Virtual DRAM Using a NAND Flash Memory Technology", IEEE Journal of Solid-State Circuits, vol. 32, No. 11, Nov. 1997, 12 pages.

Jung et al., "A 117-mm$^2$ 3.3-V Only 128-Mb Multilevel NAND Flash Memory for Mass Storage Applications," IEEE Journal of Solid-State Circuits, vol. 31, No. 11, Nov. 1996, 10 pages.

Jung et al. proposed a local self boosting ("LSB") technique in "A 3.3V 128Mb Multi-Level NAND Flash Memory for Mass Storage Applications", ISSCC96, Session 2, Flash Memory, Paper TP 2.1, IEEE, pp. 32.

Kim et al., "Fast Parallel Programming of Multi-Level NAND Flash Memory Cells Using the Booster-Line Technology", Symposium on VLSI Technology Digest of Technical Papers, (1997), 2 pages.

Notification of Transmittal of the International Search Report and the Written Opinion of the International Searching Authority, or the Declaration, issued in corresponding PCT/US2005/001962, mailed Aug. 16, 2005, 15 pages.

Nozaki et al., "A 1-Mb EEPROM with MONOS Memory Cell for Semiconductor Disk Application" IEEE Journal of Solid-State Circuits, vol. 26, No. 4, Apr. 1991, pp. 497-501.

Satoh et al., "A Novel Gate-Offset NAND Cell (GOC-NAND) Technology Suitable for High-Density and Low-Voltage Operation Flash Memories", IEDM Technical Digest, Dec. 1999, 6 pages.

Suh et al. in "A 3.3 V 32 Mb NAND Flash Memory with Incremental Step Pulse Programming Scheme," Journal of Solid-State Circuits, vol. 30, No. 11, Nov. 1995, pp. 1149-55.

Higashitani, "NAND Flash Memory with Boosting", U.S. Appl. No. 11/381,865, filed May 5, 2006, 35 pages.

Higashitani, "Boosting Methods for NAND Flash Memory", U.S. Appl. No. 11/381,874, filed May 5, 2006, 38 pages.

Oowada, "Self-Boosting Method with Suppression of High Lateral Electric Fields", U.S. Appl. No. 11/394,460, filed Mar. 30, 2006, 41 pages.

Oowada, "Self-Boosting Method with Suppression of High Lateral Electric Fields", U.S. Appl. No. 11/394,803, filed Mar. 30, 2006, 40 pages.

Pham et al., "Methods for Active Boosting to Minimize Capacitive Coupling Effect Between Adjacent Gates of Flash Memory Devices", U.S. Appl. No. 11/319,260, filed Dec. 27, 2005, 34 pages.

Pham et al., "Active Boosting to Minimize Capacitive Coupling Effect Between Adjacent Gates of Flash Memory Devices", U.S. Appl. No. 11/319,908, filed Dec. 27, 2005, 31 pages.

European Patent Office, "Office Action" mailed for European Patent Application No. 05711788.9 on Nov. 28, 2006, 5 pages.

Taiwanese Patent Office, "Office Action of the IPO," corresponding in Taiwanese Patent Application No. 094103221 on Dec. 31, 2007, 3 pages.

EPO/ISA, "Invitation to Pay Additional Fees," mailed in related PCT Application No. PCT/US2006/062338 on Aug. 16, 2007, 7 pages.

EPO/ISA, "Notification of Transmittal of the International Search Report and Written Opinion of the International Searching Authority, or the Declaration," mailed in related PCT Application No. PCT/US2006/062338 on Dec. 15, 2007, 24 pages.

UPSTO, "Office Action," mailed in related U.S. Appl. No. 11/609,688 on Feb. 6, 2008, 27 pages.

EPO, "Office Action," corresponding European Patent Application No. 05711788.9, mailed on Mar. 20, 2008, 5 pages.

China State Intellectual Property Office, "Office Action," corresponding Chinese Patent Application No. 200580008885.9, mailed on Jun. 27, 2008, 7 pages (including translation).

USPTO, "Notice of Allowance and Fee(s) Due," corresponding U.S. Appl. No. 11/609,688, mailed on Aug. 8, 2008, 6 pages.

\* cited by examiner

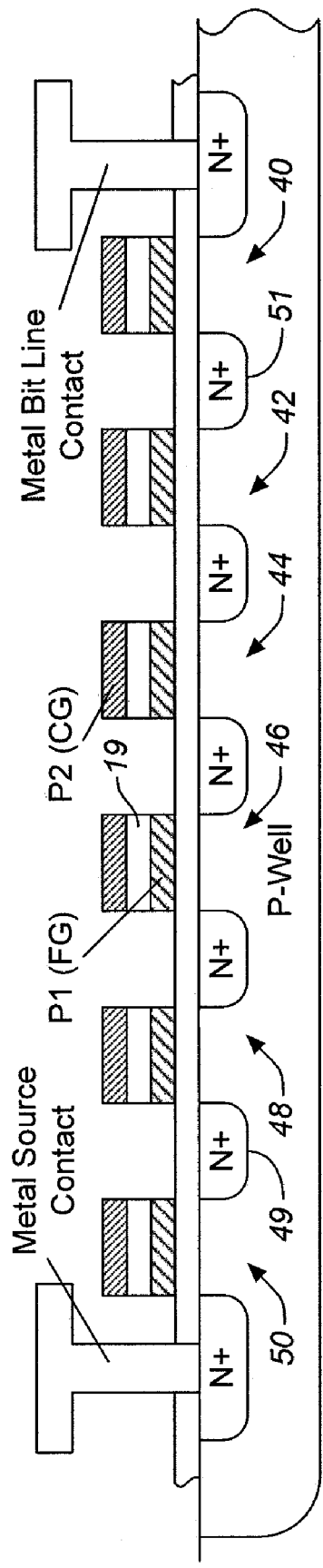
FIG. 2B *(PRIOR ART)* (Section A-A)

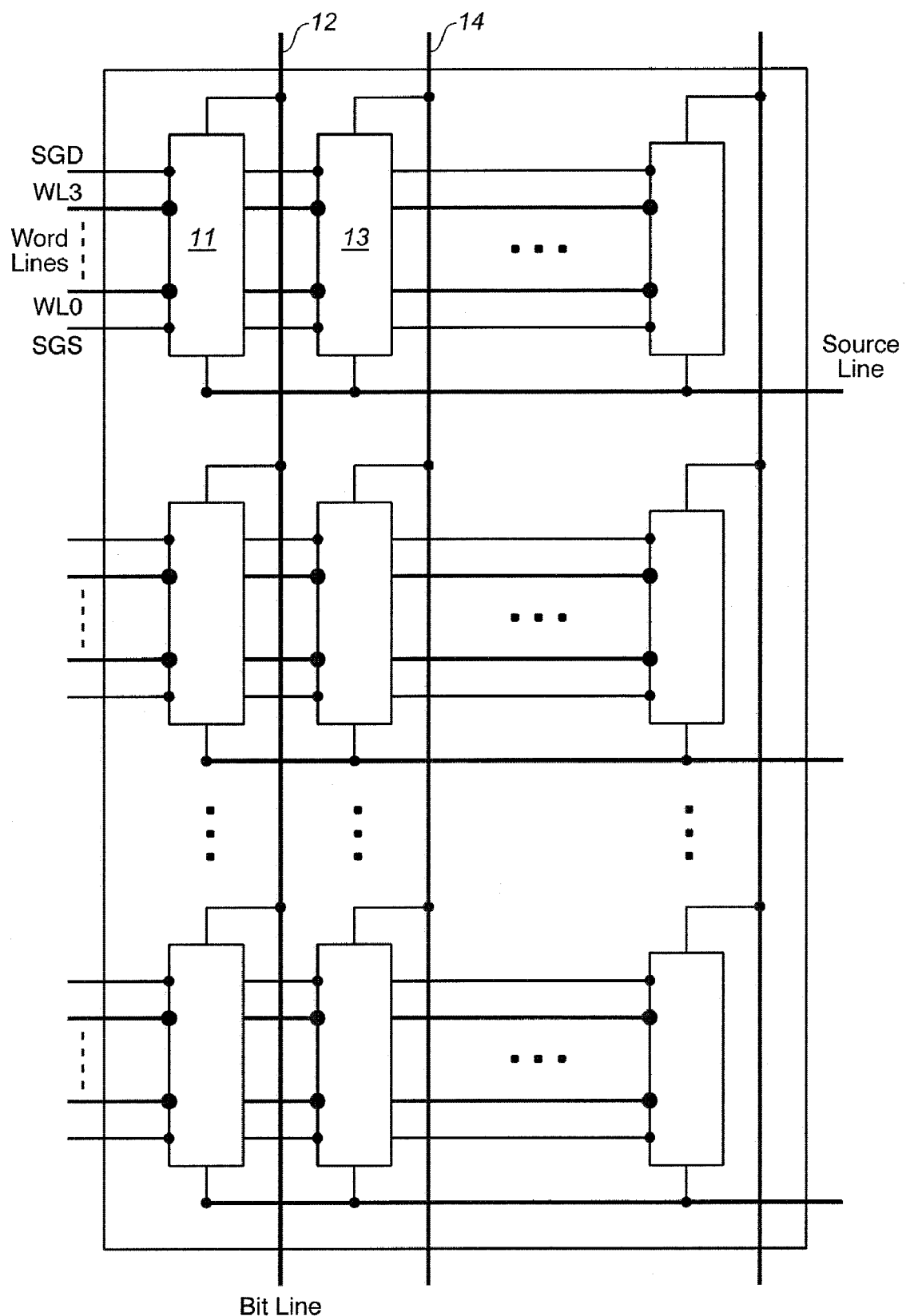
*FIG._3B*

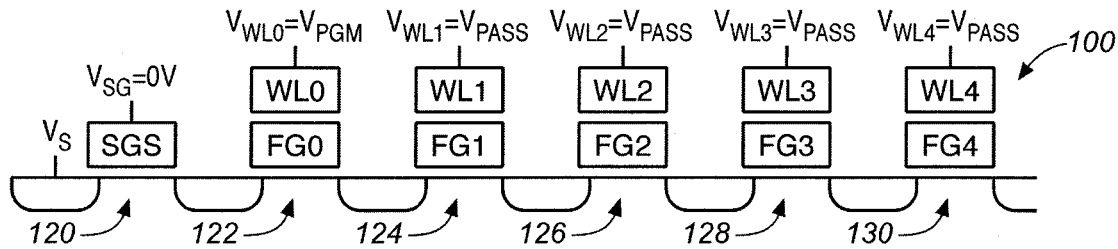
FIG. 4A *(PRIOR ART)*
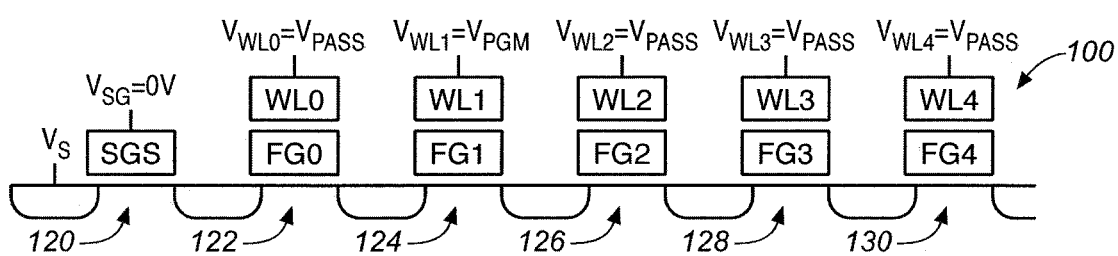
FIG. 4B *(PRIOR ART)*
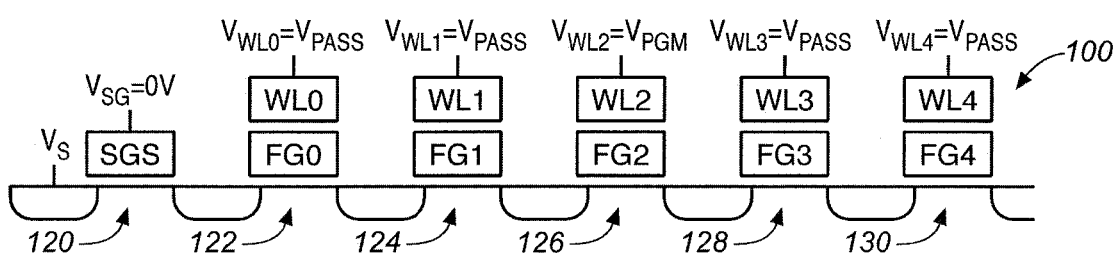
FIG. 4C *(PRIOR ART)*
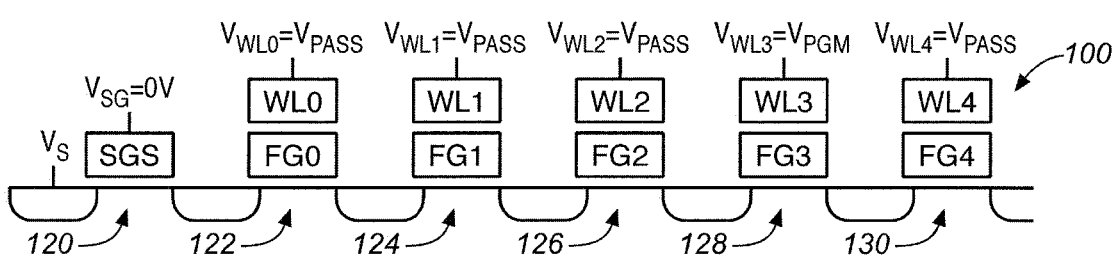
FIG. 4D *(PRIOR ART)*

SELF-BOOSTING METHOD FOR FLASH MEMORY CELLS

CROSS REFERENCE TO RELATED APPLICATION

This application is a continuation-in-part of U.S. patent application Ser. No. 10/774,014, filed Feb. 6, 2004, entitled "Self-Boosting System for Flash Memory Cells", now Pat. No. 7,161,833, which applications are incorporated herein in their entirety by this reference for all purposes.

BACKGROUND OF THE INVENTION

This invention relates generally to non-volatile semiconductor memories of the flash EEPROM (Electrically Erasable and Programmable Read Only Memory) type, particularly to structures and methods of operating NAND types of memory cell arrays.

There are many commercially successful non-volatile memory products being used today, particularly in the form of small form factor cards, which use an array of flash EEPROM cells.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0–BL4 (of which BL1–BL3 are also labeled 12–16) represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0–WL3 (labeled P2 in FIG. 2B, a cross-sectional along line A—A of FIG. 2A) and string selection lines SGD and SGS extend across multiple strings over rows of floating gates, often in polysilicon (labeled P1 in FIG. 2B). However, for transistors 40 and 50, the control gate and floating gate may be electrically connected (not shown). The control gate lines are typically formed over the floating gates as a self-aligned stack, and are capacitively coupled with each other through an intermediate dielectric layer 19, as shown in FIG. 2B. The top and bottom of the string connect to the bit line and a common source line respectively, commonly through a transistor using the floating gate material (P1) as its active gate electrically driven from the periphery. This capacitive coupling between the floating gate and the control gate allows the voltage of the floating gate to be raised by increasing the voltage on the control gate coupled thereto. An individual cell within a column is read and verified during programming by causing the remaining cells in the string to be turned on by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

Relevant examples of NAND type flash memories and their operation are provided in the following U.S. patents/patent applications, all of which are incorporated herein by reference: U.S. Pat. Nos. 5,570,315; 5,774,397; 6,046,935, 6,456, 528 and 6,522,580.

The charge storage elements of current flash EEPROM arrays are most commonly electrically conductive floating gates, typically formed from doped polysilicon material. However, other materials with charge storing capabilities, that are not necessarily electrically conductive, can be used as well. An example of such an alternative material is silicon nitride. Such a cell is described in an article by Takaaki Nozaki et al., "A 1-Mb EEPROM with MONOS Memory Cell for Semiconductor Disk Application" IEEE Journal of Solid-State Circuits, Vol. 26, No. 4, April 1991, pp. 497–501.

Memory cells of a typical non-volatile flash array are divided into discrete blocks of cells that are erased together. That is, the block contains the minimum number of cells that are separately erasable together as an erase unit, although more than one block may be erased in a single erasing operation. Each block typically stores one or more pages of data, a page defined as the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 byes of user data, following a standard established with magnetic disk drives, plus some number of bytes of overhead information about the user data and/or the block in which it is stored.

As in most all integrated circuit applications, the pressure to shrink the silicon substrate area required to implement some integrated circuit function also exists with flash EEPROM arrays. It is continually desired to increase the amount of digital data that can be stored in a given area of a silicon substrate, in order to increase the storage capacity of a given size memory card and other types of packages, or to both increase capacity and decrease size. Another way to increase the storage density of data is to store more than one bit of data per memory cell charge storage element. This is accomplished by dividing the allowable voltage or charge storage window of a charge storage element into more than two states. The use of four such states allows each cell to store two bits of data, eight states stores three bits of data per cell, and so on. A multiple state flash EEPROM structure and operating is described in U.S. Pat. Nos. 5,043,940; 5,172,338, 5,570,315 and 6,046,935.

A typical architecture for a flash memory system using a NAND structure will include NAND arrays, where each array includes several NAND strings. For example, FIG. 3A shows only three NAND strings 11, 13 and 15 of the memory array of FIG. 2A, which array contains more than three NAND strings. Each of the NAND strings of FIG. 3A includes two select transistors and four memory cells. For example, NAND string 11 includes select transistors 20 and 30, and memory cells 22, 24, 26 and 28. NAND string 13 includes select transistors 40 and 50, and memory cells 42, 44, 46 and 48. Each string is connected to the source line by its select transistor (e.g. select transistor 30 and select transistor 50). A selection line SGS is used to control the source side select gates. The various NAND strings are connected to respective bit lines by select transistors 20, 40, etc., which are controlled by select line SGD. In other embodiments, the select lines do not necessarily need to be in common. Word line WL3 is connected to the control gates for memory cell 22 and memory cell 42. Word line WL2 is connected to the control gates for memory cell 24 and memory cell 44. Word line WL1 is connected to the control gates for memory cell 26 and memory cell 46. Word line WL0 is connected to the control gates for memory cell 28 and memory cell 48. As can be seen, each bit line and the respective NAND string comprise the columns of the array of memory cells. The word lines (WL3, WL2, WL1 and WL0) comprise the rows of the array. Each word line connects the control gates of each memory cell in the row. For example, word line WL2 is connected to the control gates for memory cells 24, 44, and 64.

FIG. 3B is a circuit diagram depicting a number of NAND arrays, with each array controlled by a set of common word lines. The array of FIGS. 2A and 3 appears as the top array in FIG. 3B. As shown in FIG. 3B, each NAND string (e.g. 11, 13) in the same array is connected to one of a plurality of bit lines 12, 14, . . . and to a common source line, and are controlled by a common set of word lines (WL0–WL3).

Each memory cell can store data (analog or digital). When storing one bit of digital data (binary memory cell), the range of possible threshold voltages of the memory cell is divided into two ranges which are assigned logical data "1" and "0". In one example of a NAND type flash memory, the voltage threshold is negative after the memory cell is erased, and defined as logic "1." The threshold voltage after a program operation is positive and defined as logic "0." When the threshold voltage is negative and a read is attempted with 0 volt applied to its control gate, the memory cell will conduct current to indicate logic one is being stored. When the threshold voltage is positive and a read operation is attempted, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges, each range assigned to one data value. Memories storing data by differentiation between multiple (i.e. more than two) ranges of threshold voltage are known as multiple state memories. In one example of a NAND type memory, the threshold voltage after an erase operation is negative and defined as "11". Positive threshold voltages are used for the states of "10", "01", and "00."

When programming a NAND flash memory cell, a program voltage is applied to the control gate and the channel area of the NAND string that is selected for programming is grounded (0V). Electrons from the channel area under the NAND string are injected into the floating gate. When electrons accumulate in the floating gate, the floating gate becomes negatively charged and the threshold voltage of the cell is raised. To ground the channel area of the selected NAND string, the corresponding bitline is grounded (0 volt), while the SGD is connected to a sufficiently high voltage (typically $V_{dd}$ at for example 3.3 volts) that is higher than the threshold voltage of the select transistors. To apply the program voltage to the control gate of the cell being programmed, that program voltage is applied on the appropriate word line. As discussed above, that word line is also connected to one cell in each of the other NAND strings that utilize the same word line. For example, when programming cell 24 of FIG. 3A, the program voltage will also be applied to the control gate of cell 44 because both cells share the same word line. A problem arises when it is desired to program one cell on a word line without programming other cells connected to the same word line, for example, when it is desired to program cell 24 and not cell 44. Because the program voltage is applied to all cells connected to a word line, an unselected cell (a cell that is not to be programmed) on the word line may become inadvertently programmed. For example, cell 44 is adjacent to cell 24. When programming cell 24, there is a concern that cell 44 might unintentionally be programmed. The unintentional programming of the unselected cell on the selected word line is referred to as "program disturb." More generally speaking, "program disturb" is used to describe any unwanted threshold voltage shift, either in the positive or negative direction, which can occur during a programming operation and is not necessarily limited to the selected word line.

Several techniques can be employed to prevent program disturb. One method known as "self boosting" ("SB") is proposed by K. D. Suh et al. in "A 3.3 V 32 Mb NAND Flash Memory with Incremental Step Pulse Programming Scheme," Journal of Solid-State Circuits, Vol 30, No. 11, November 1995, pp. 1149–55. During programming using the SB scheme, the channel areas of the unselected NAND strings are electrically isolated from their corresponding bit lines. Subsequently an intermediate pass voltage (e.g. 10 volts) is applied to the unselected word lines while a high program voltage (e.g. 18 volts) is applied to the selected word line. In this application, the terms "isolate" and "electrically isolate" are used interchangeably, and the terms "writing voltage," "program voltage" and "programming voltage" are used interchangeably. The channel areas of the unselected NAND strings are capacitively coupled to the unselected word lines, causing a voltage (e.g. six volts, assuming a coupling ratio of 0.6) to exist in the channel areas of the unselected NAND strings. This so called "Self Boosting" reduces the potential difference between the channel areas of the unselected NAND strings and the program voltage that is applied to the selected word line. As a result, for the memory cells in the unselected NAND strings and especially for the memory cells in such strings on the selected word line, the voltage across the tunnel oxide and hence the program disturb are significantly reduced.

Referring to FIG. 3A, when a self boosting program technique is applied to the memory array in FIG. 3A to program one of the cells on bit line 12, for example, zero volt is applied to the bit line 12 and voltage $V_{dd}$ (e.g. 3.3 volts) is applied to the bit line 14. The voltage $V_{dd}$ is applied to the drain select line SGD to turn on the transistors 20 and 40 and zero volt is applied to the source select line SGS to turn off transistors 30 and 50. Assuming that all of the memory cells in the array 42–48 are in the normally on states (e.g. erased or negative threshold voltage state), the channel potential of all the cells in the NAND string between transistors 40 and 50 is given by the difference between $V_{dd}$ applied to SGD and the threshold voltage of the select transistor 40. For example, if $V_{dd}$ is 3.3 volts and the threshold voltage of transistor 40 is 1.3, volts, then the channel potential of all the cells 42–48 is charged to 2 volts. The above operation can be referred to as "pre-charging" since the channel potential is pre-charged to a predefined potential of about 2V in this case. Since transistor 50 is turned off and transistor 40 will turn off automatically after the channel potential of the NAND string has reached a sufficiently high value (2V in this case) the channel potential of memory cells 42–48 becomes floating. Therefore, when the high program voltage Vpgm (e.g. 18 volts) is applied to the word line WL2, and an intermediate voltage Vpass (e.g. 10 volts) is applied to the remaining word lines, the channel potential of memory cells 42–48 is bootstrapped or boosted from 2 volts, the initial pre-charged level, to a value such as 8 volts, due to capacitive coupling, assuming a coupling ratio of about 0.6. Therefore, even though a high voltage such as 18 volts is applied to the control gate of memory cell 44, the potential difference between such high voltage and the channel potential is not adequate to cause electron tunneling through the oxide to the floating gate of memory cell 44, thereby preventing program disturb.

A NAND string is typically (but not always) programmed from the source side to the drain side, for example, from memory cell 28 to memory cell 22. When the programming process is ready to program the last (or near the last) memory cell of the NAND string, if all or most of the previously programmed cells on the string being inhibited (e.g. string 13) were programmed, then there is negative charge in the floating gates of the previously programmed cells. Because of this negative charge on the floating gates, the pre-charging can not take place completely, resulting in a lower initial potential of the channel area under the NAND string and the subsequent self-boosting of such channel area becomes less effective as well. Therefore, the boosted potential in the channels of the unselected NAND strings may not become high enough and there still may be program disturb on the last few word lines. For example, when programming voltage is applied to WL3, if cells 48, 46, and 44 on a string that is inhibited were programmed, then each of those memory cells 44, 46, 48 has a negative charge on its floating gate which will limit the boosting level of the self boosting process and possibly cause program disturb on cell 42.

In view of the above problem, as an improvement, T. S. Jung et al. proposed a local self boosting ("LSB") technique in "A 3.3V 128 Mb Multi-Level NAND Flash Memory for Mass Storage Applications", ISSCC96, Session 2, Flash Memory, Paper TP 2.1, IEEE, pp. 32.

In the LSB scheme, when applying a high programming voltage to the word line WL2, in order to reduce or prevent program disturb in regard to memory cell 44 on a string that is inhibited, 0 volts are applied to word lines WL1 and WL3 so that memory cells 42 and 46 are turned off. Then the channel potential in memory cell 44 is not or at least less influenced by the self boosting in the channel regions of memory cells 42, 46, and 48. Therefore, the channel potential of the channel region of memory cell 44 may be self boosted by the high programming voltage Vpgm to a voltage level that is higher than that achieved when the channel region of memory cell 44 is influenced by the self boosting in the remaining memory cells 42, 46, and 48. This prevents program disturb when memory cell 24 is being programmed. For a more detailed explanation of self boosting and local self boosting, please see U.S. Pat. No. 6,107,658, especially the description in columns 6–10.

Another technique proposed as an alternative to local self boosting is described in U.S. Pat. No. 6,525,964 to Tanaka et al. and is known as erased area self boosting ("EASB"). EASB differs from LSB in that, instead of turning off both memory cells on either side of the unselected cell to prevent program disturb of the cell as in LSB, EASB turns off only the memory cell on the source side of the unselected cell. For example, where memory cell 24 is being programmed, only memory cell 46 is being turned off without turning off memory cell 42, in order to prevent program disturb at cell 44.

While LSB and EASB maybe advantageous for many applications, certain problems are still encountered when these schemes are used in their current form, especially when the memory cell dimensions of future generation devices are continually reduced or scaled down. It is therefore desirable to provide improved self boosting schemes where such problems are alleviated.

SUMMARY OF THE INVENTION

In reference to FIGS. 2B and 3, the N+ diffused region 49 serves as the drain of source select transistor 50 and the source of the neighboring memory cell or transistor 48. The terms "memory cell", "charge storage transistor" and "transistor" are used interchangeably herein when referring to elements in the strings of the flash memory, such as those shown in FIGS. 2B and 3. During programming in any one of the above-described self boosting schemes of any one of the transistors 22, 24 or 26, zero volt is applied to the gate of transistor 50, and in most instances an intermediate voltage Vpass (e.g. 10 volts) is applied to the control gate of transistor 48. Thus, the channel region of transistor 48 may be boosted to a value such as 8 volts, assuming a coupling ratio of 0.6 (assuming that the channel regions are pre-charged to 2 volts before boosting). This boosted channel voltage of transistor 48 can cause breakdown, possibly due to band-to-band tunneling, of the drain area 49 of transistor 50. This breakdown can cause the boosted channel area of transistor 48 and of the channel area of the other memory cells in the same NAND string to discharge so that the channel potential will decrease and program disturb may occur. Another mechanism that may occur is that the electrons generated by the breakdown are being accelerated towards the boosted channel area under transistor 48; this may cause so called hot electrons that may subsequently be injected in the floating gate of transistor 48, causing a threshold voltage shift. This threshold voltage shift may cause the transistor 48 to change from one charge state to another, such as from one programmed state to a different programmed state, which is undesirable. Such change of state can be prevented by using appropriate biasing conditions that aim to prevent the breakdown of the drain area 49 of transistor 50.

The undesirable change of charge state can be prevented in multi-level threshold voltage type memories as well as binary-level threshold voltage memories by using appropriate biasing conditions. The application of appropriate biasing conditions may have the effect of causing breakdown mechanism(s) such as band-to-band tunneling at the drain side of the source select transistor to be reduced to such an extent that it does not result in a change of the desired charge storage state of the transistor next to the source select transistor to a different charge state; in some cases, such mechanism(s) may be suppressed completely.

In one embodiment, source select transistor breakdown at the drain area is prevented by reducing the voltage applied to the transistor (target transistor) in a string next to the source select transistor to a value lower than that normally used for boosting the channel voltage in a self boosting scheme to reduce or prevent program disturb. In one implementation of such embodiment, the voltage applied to the target transistor may be in the range of one to three volts. In another implementation, the boosting voltage coupled to some of the transistors other than the target transistor to prevent program disturb may be higher that that coupled to the target transistor by at least 50%.

In another embodiment, a reduced voltage is applied not only to the target transistor next to or adjacent to the source select transistor but also to one or more additional charge storage transistors in the same string as the target transistor, and adjacent to the target transistor. This is expected to be effective in further preventing or reducing program disturb. Preferably, the voltage coupled to the target transistor is lower than that or those coupled to such additional transistor(s). In one implementation of such embodiment, the voltage applied to the target transistor as well as the additional transistor(s) may be in the range of one to six volts. In another implementation, the boosting voltage coupled to some of the transistors to prevent program disturb may be higher that that or those coupled to the target transistor and the additional transistor(s) by at least 50%.

The above-described breakdown can also occur at the drain area of the transistor in a string next to the drain select transistor, such as transistor area 51 of drain select transistor 40 in FIG. 2B, even though the drain side select gate typically has a higher gate voltage, such as in the range of 1.5–2.5V during boosting, than the source side select gate which is typically at a 0V gate voltage during boosting. Drain select transistor breakdown at the source area is prevented by reducing the voltage applied to the transistor (target transistor) in a string next to the drain select transistor to a value lower than that normally used for boosting the channel voltage in a self boosting scheme to reduce or prevent program disturb. In one implementation of such embodiment, the voltage applied to the target transistor may be in the range of one to three volts. In another implementation, the boosting voltage coupled to some of the transistors other than the target transistor to prevent program disturb may be higher that that coupled to the target transistor by at least 50%.

As in the case above regarding preventing of drain area breakdown of the source select transistor, a reduced voltage may also be applied to one or more additional charge storage transistors adjacent to and in the same string as the target transistor, which is located next to the drain select transistor. Preferably, the voltage coupled to the target transistor is lower than that or those coupled to such additional transistor(s). In one implementation of such embodiment, the voltage applied to the target transistor and the additional transistor(s) may be in the range of one to six volts. In another implementation, the boosting voltage coupled to some of the transistors to prevent program disturb may be higher that that or those coupled to the target transistor and the additional transistor(s) by at least 50%.

The above described source select transistor drain area breakdown and drain select transistor source area breakdown may occur during the writing or programming of any of the transistors in a string of charge storage transistors. Therefore, to reduce the program disturb, the above scheme may be applied during the sequential programming or writing of two or more transistors in the string, or indeed during the sequential programming or writing of all of the transistors in the string except during the programming of the transistor immediately adjacent to the source or drain select transistor.

In the same vein, the above-described scheme may be applied, if desired, in conjunction with other self boosting schemes, such as with any one or more of the self boosting and the pre-charging schemes described herein and with pre-charging schemes other than the one described herein.

When the memory cell dimensions of future generation devices become smaller, the channel length of the memory cells in an EASB scheme may become too short to be able to isolate electrically the two separately boosted channel areas on the drain and source sides of each of the transistors coupled to the selected word line. As a result, the boosted channel voltage may be lowered resulting in program disturb. Applicant proposes to improve the isolation between the two boosted areas by biasing two or more word lines or control gates, preferably ones adjacent to one another, on the source side of and next to the transistors coupled to the selected word line to increase effectively the channel length of the isolation memory cells or transistors to thereby reduce leakage between the two boosted areas. Preferably, the biasing conditions are such that band-to-band tunneling is also reduced along with leakage reduction at the same time.

In the above-described improved EASB scheme, since the isolation occurs only on the source side of the transistors coupled to the selected word line, there may be no need at least in some embodiments to similarly reduce the boosting voltage coupled to the cells or transistors on the drain side of such transistors, so that the voltage level(s) coupled to the two or more word lines or control gates are lower than that/those coupled to the cells or transistors on the drain side of such transistors. As noted above, the above-described improved EASB scheme is particularly useful for memory arrays with cell dimensions that are small, such as with cell dimensions below 130 or 100 nanometers.

When the memory cell dimensions of future generation devices become smaller, the channel length of the memory cells in a LSB scheme may also become too short to be able to isolate electrically the channel areas of unselected transistors coupled to the selected word line and the boosted channel areas on the drain and source sides of such transistors. As a result, the boosted channel voltage may be lowered resulting in program disturb. Applicant proposes to reduce the leakage caused by the short channel length of the memory cells by biasing two or more word lines or control gates, preferably ones adjacent to one another, both on the source side and on the drain side of and next to the transistors coupled to the selected word line to increase effectively the channel length of the isolation memory cells or transistors. In other words, voltage level(s) are coupled to two sets of transistors to isolate electrically the channel area of at least one unselected transistor coupled to the selected word line from the neighboring channel areas in the same string as the unselected transistor, where each set includes at least two transistors, and where the two sets are located on opposite sides of the unselected transistor coupled to the selected word line. Preferably, the voltage level(s) is/are such that a transistor with one of the possible charged states with a lower voltage threshold (e.g. one with a negative threshold voltage, such as that of an unprogrammed transistor) in a selected string coupled to at least one of the voltage level(s) will be turned on but a transistor with one of the possible charged states at a higher voltage threshold (e.g. one with a positive threshold voltage, such as that of a programmed transistor) in a selected string coupled to the at least one of the voltage level(s) will be turned off. Preferably, the voltage levels are such that both the leakage due to the short channel length of the memory cells and band-to-band tunneling induced breakdown are reduced at the same time.

For some applications and designs, complete electrical isolation on the drain side of the selected word line in a LSB scheme may not be necessary or desirable. In such event, a modified LSB scheme may be implemented, where the boosting voltage coupled to the cells or transistors on the drain side of the selected word line are of a value that does not cause these transistors to be completely turned off, but where some electrical isolation is provided on the drain side of the selected word line.

The reduction of the leakage between the two boosted areas is especially critical for low values of Vpass and when the threshold voltage of the memory cells that act as the isolation transistors are in the erased state. To be able to turn-off the isolation transistors in the case where these transistors are in the erased state, a certain positive boosted voltage at the source side is needed. This positive voltage is built up at the start of the boosting process when the Vpass voltage is ramped up from a low value (say 0V) to a high value (say in the range of 5–10V). At low values of Vpass, the channel areas are boosted to a less high voltage; as a result, the isolation transistors will turn off later, thus allowing more charge to be transferred from the higher boosted drain area thereby lowering the drain side area boosted voltage. Having two or more memory cells acting as isolation transistors will effectively increase the channel length and thereby the isolation properties of those isolation transistors. Furthermore, when two or more memory cells are used as isolation transistors, the probability that two or more of those memory cells are in the erased state is less than that of only one memory cell acting as an isolation transistor. In the case of an MLC memory cell in which four levels are stored, the probability that both isolation memory cells are in the erased state is only 6.25% while in the case of only one isolation memory cell, that probability is 25%.

Another mechanism that can cause program disturb occurs especially at relatively high values of Vpass. In such a case, the drain side area is boosted to a high voltage which can cause breakdown at the drain side of the isolation transistor that is located next to the selected wordline. A possible mechanism of that breakdown is band-to-band tunneling at or close to the edge of the drain area of the isolation memory cell. Other breakdown mechanisms may occur as well. Due to the breakdown, electrons are generated that may become so called "hot electrons" since these electrons can be accelerated by the strong electric field that is present in the neighborhood of the selected wordline. These hot electrons may be injected in the floating gate of the memory cell on the selected wordline or in floating gates of neighboring memory cells, thus changing the threshold voltage of those memory cells and possibly causing a change in the charge storage state of the memory cell. By choosing appropriate biasing voltages for the isolation memory cells, the breakdown at the drain side area of the isolation transistor can be prevented or at least suppressed significantly. Another possible side effect of the breakdown is that the drain side boosted area is partly discharged by the breakdown. Since the breakdown generates hole/electron pairs, electrons flowing to the drain side boosted channel area will lower the boosted potential of that area thereby possibly causing increased program disturb.

To boost the channel voltage of the transistors in the string to be inhibited so as to prevent or reduce program disturb, different boosting voltages are coupled to the transistors in the string. In one embodiment, the boosting voltage coupled to at least one of the charge storage transistors adjacent to the selected word line (word line selected during programming to program a charge storage transistor) is different from the boosting voltage(s) coupled to at least some of the remaining transistors between said selected word line and the bit line.

The different aspects of the invention and embodiments thereof described herein may be used individually or in various combinations.

BRIEF DESCRIPTION OF THE DRAWINGS

FIG. 2B is a cross-sectional view of the prior art NAND array of FIG. 2A taken along the line A—A.

FIG. 3B is a circuit diagram depicting a number of NAND arrays, with each array controlled by a set of common word lines.

FIGS. 4A–4D are cross-sectional views of a NAND string to illustrate the bias voltages in the string during four consecutive time intervals to illustrate a conventional self-boosting programming method of respective cells in the string.

For simplicity and description, identical components are labeled by the same numerals in this application.

DETAILED DESCRIPTION OF EXEMPLARY EMBODIMENTS

Memory System

Figure 1:
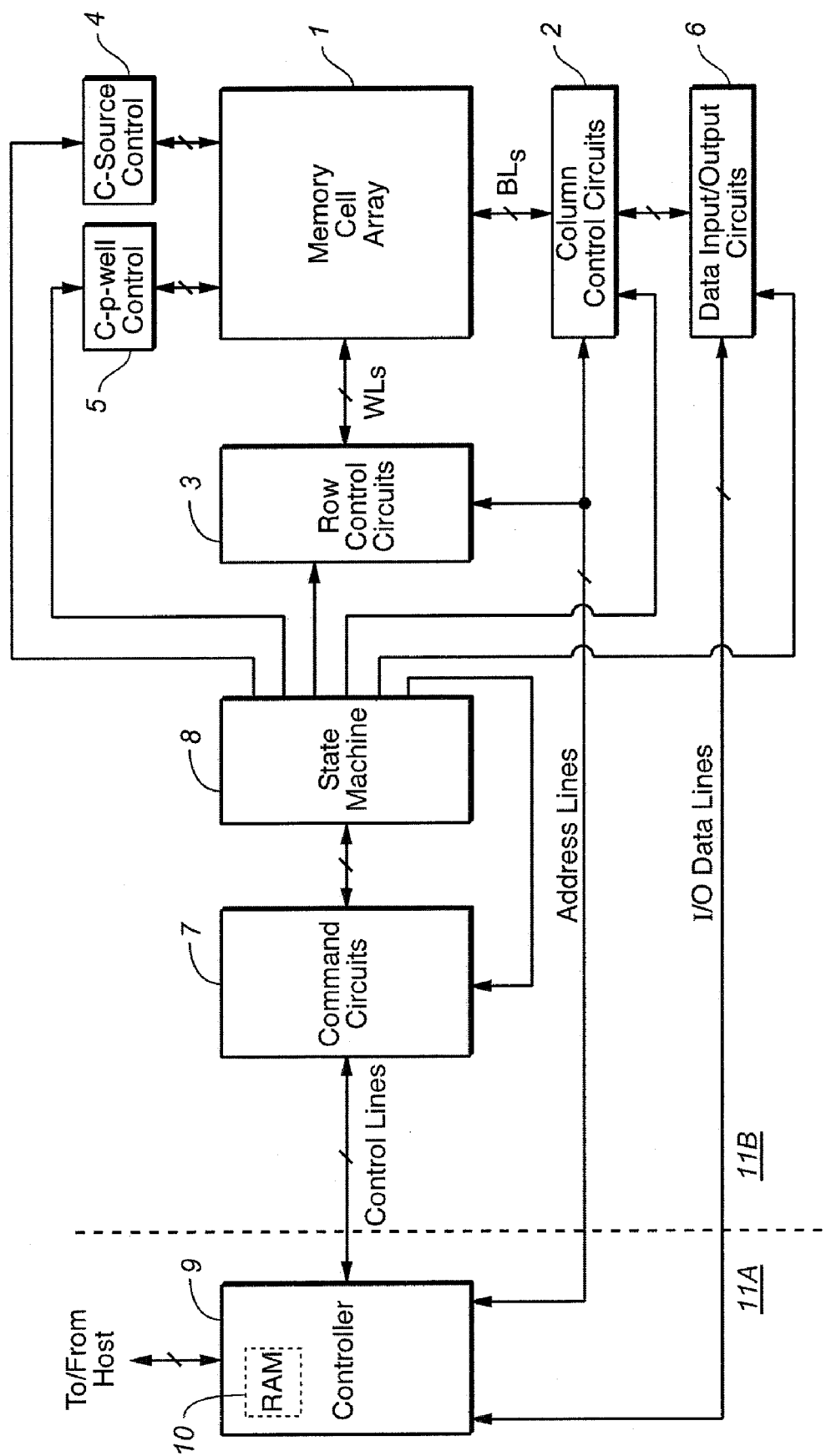
FIG. 1 is the block diagram of a type of memory system in which the memory cell array and operational improvement of the present invention may be implemented.

An example memory system in which the various aspects of the present invention may be implemented is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type that is described above in the Background and in references incorporated herein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control Circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region (cell P-well) on which the memory cells (M) are formed. The c-source control circuit 4 controls a common source line connected to the memory cells (M). The c-p-well control circuit 5 controls the cell P-well voltage.

The data stored in the memory cells (M) are read out by the column control circuit 2 and are output to external I/O lines via an I/O line and a data input/output buffer 6. Program data to be stored in the memory cells are input to the data input-output buffer 6 via the external I/O lines, and transferred to the column control circuit 2. The external I/O lines are connected to a controller 9. The controller 9 includes various types of registers and other memory including a volatile random-access-memory (RAM) 10.

Command data for controlling the flash memory device are inputted to command circuits 7 connected to external control lines that are connected with the controller 9. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 9 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 11A that includes the controller 9, and one or more integrated circuit chips 11B that each contain a memory array and associated control, input/output and state machine circuits. It is possible to integrate the memory array and controller circuits of a system together on one or more integrated circuit chips.

The memory system of FIG. 1 may be embedded as part of the host system, or may be included in a memory card that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145, which patent is expressly incorporated herein in its entirety by this reference.

FIGS. 4A–4D are cross-sectional views of a NAND string 100 showing the bias voltages in the string during four different consecutive time intervals in a conventional self-boosting programming scheme useful for illustrating an aspect of the invention. As noted above, a NAND string is typically programmed sequentially from the source side to the drain side, so from WL0 to WL4 in FIGS. 4A–4D, the first cell to be programmed is memory cell 122, the next one is memory cell 124 and so on up to memory cell or transistor 130. NAND string 100 may contain many more cells than the five cells 122–130 shown in FIG. 4A; typically 16 or 32 memory cells are connected in series in one NAND string. The NAND string 100 may be implemented in the form illustrated above in reference to FIG. 2B, although other implementations are also possible. NAND string 100 may be controlled and operated in the manner described above.

Figure 3A:
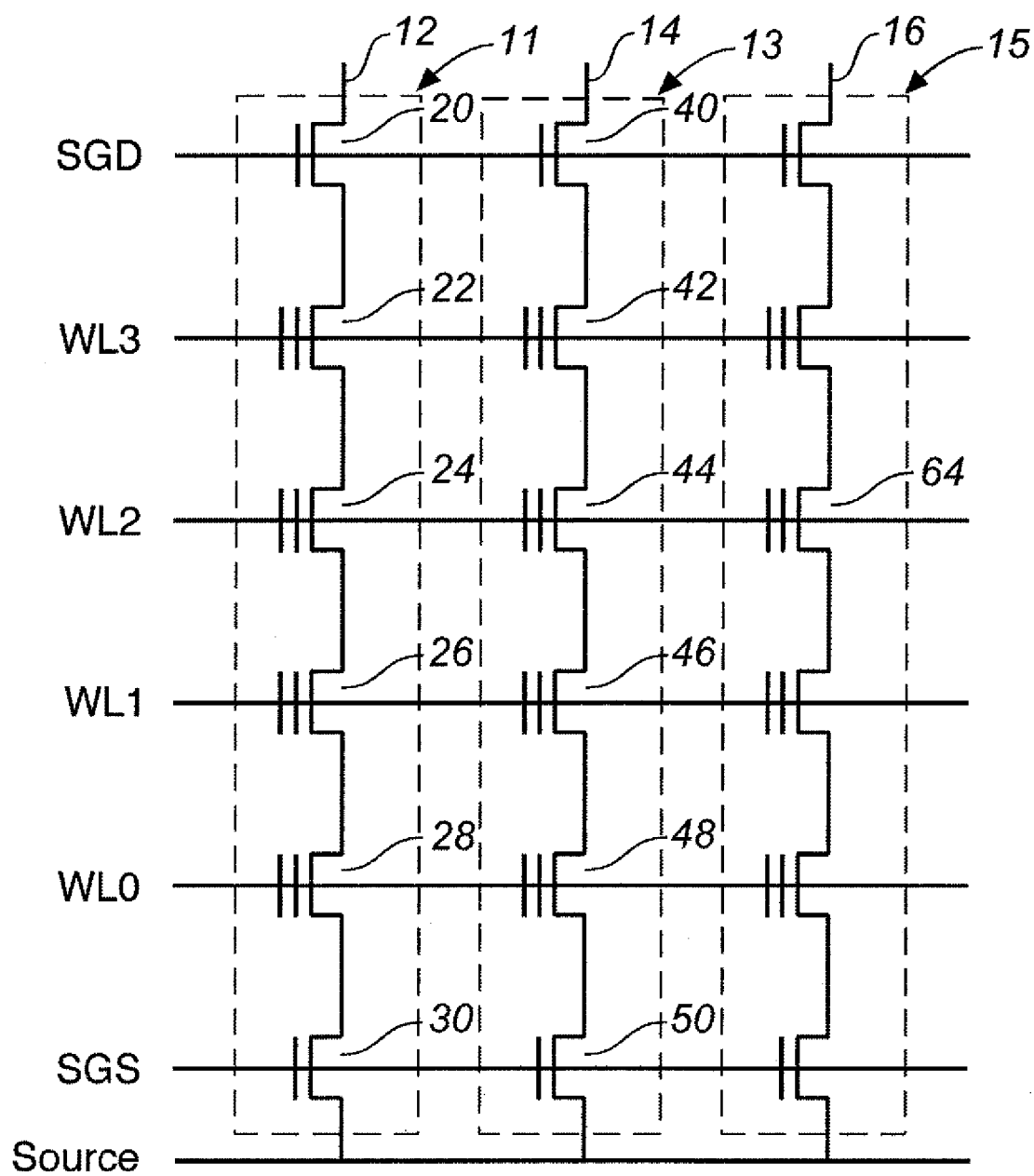
FIG. 3A is a circuit diagram depicting three of the NAND strings of FIG. 2A.
Figure 5A:
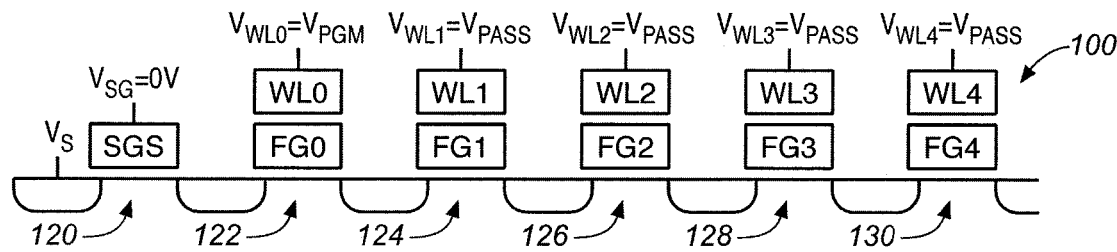
FIGS. 5A–5D are cross-sectional views of a NAND string showing the bias voltages in the string during four consecutive time intervals in an improved self-boosting programming scheme useful to illustrate the invention.
Figure 5B:
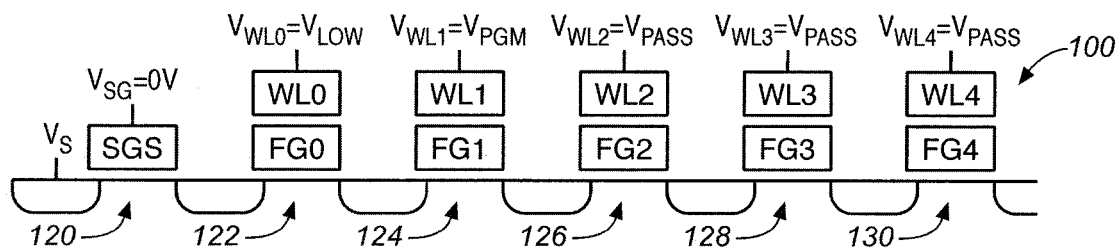
Figure 5C:
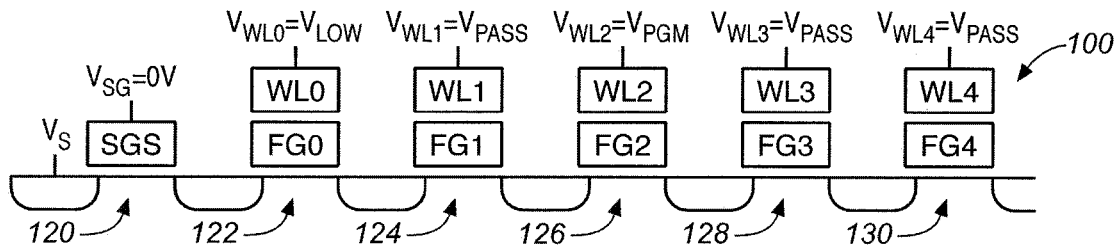
Figure 5D:
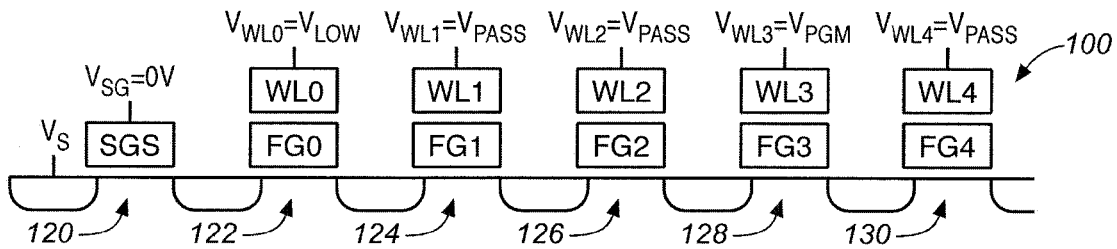
Figure 6A:
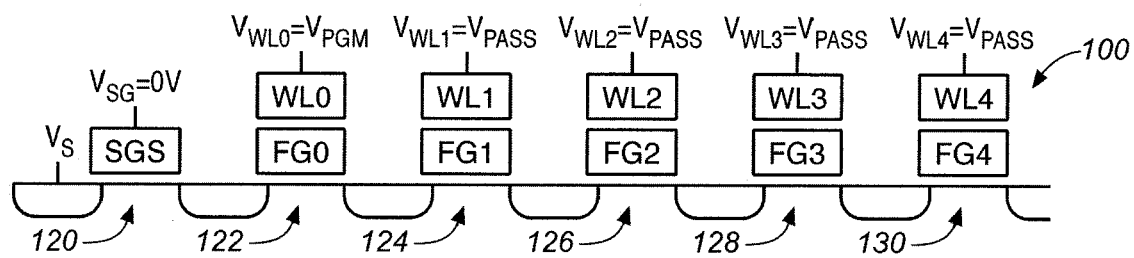
FIGS. 6A–6E are cross-sectional views of a NAND string showing the bias voltages in the string during five consecutive time intervals to illustrate a conventional erased area self-boosting programming scheme of respective cells in the string.
Figure 6B:
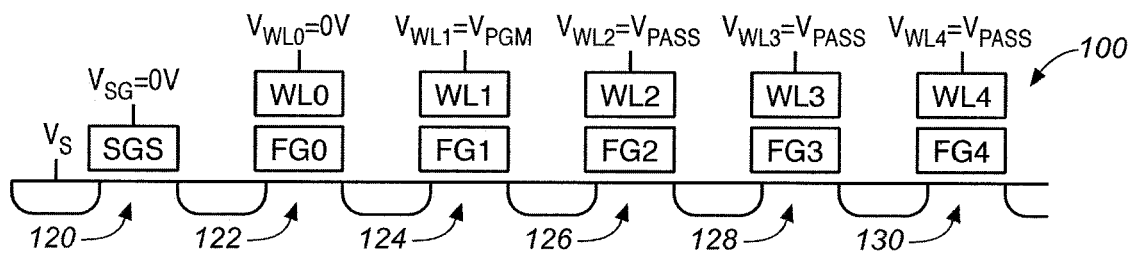
Figure 6C:
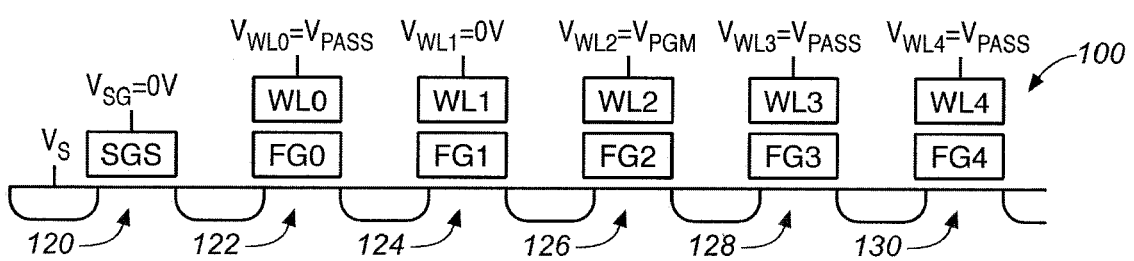
Figure 6D:
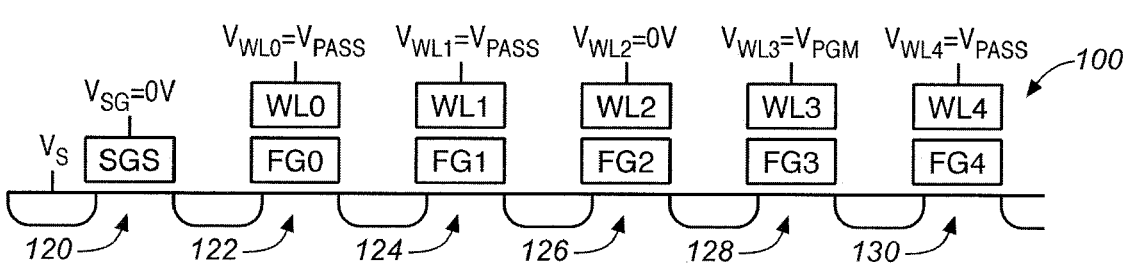
Figure 6E:
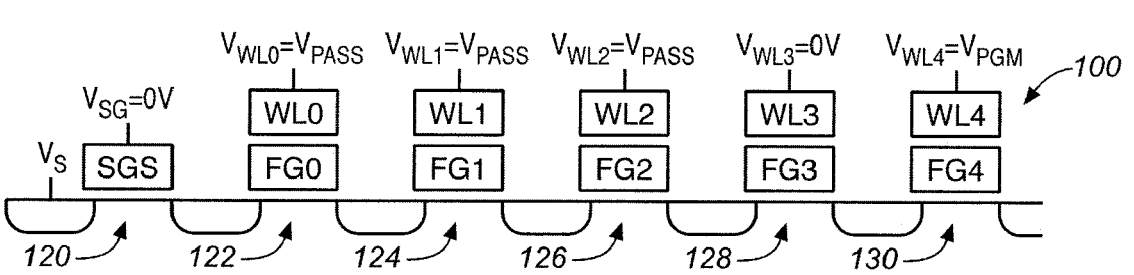

FIG. 4A illustrates the biasing voltages applied to the NAND string 100 when the cell 122 of the string is being programmed. As shown in FIG. 4A, zero volt is applied to SGS, the gate of source select transistor 120. Furthermore, Vs which can be zero volt or a somewhat higher voltage is applied to the source line. Applying a voltage larger than zero volt to the source line during programming improves the isolation characteristics of the select transistor 120. A high programming voltage $V_{PGM}$ is applied to the word line WL0 and an intermediate voltage $V_{PASS}$ is applied to the remaining word lines as shown in FIG. 4A. The high $V_{PGM}$ causes electrons from the channel to tunnel through the oxide to the floating gate FG0 in transistor 122. As noted above, the intermediate voltage $V_{PASS}$ is applied to reduce or prevent program disturb in unselected cells or transistors that are addressed by the word line WL0 by boosting the channel electrical potentials of such unselected transistors. This is the conventional self boosting scheme. The programming voltage $V_{PGM}$ may be applied in increasing increments, each increase followed by a read cycle to test the threshold voltage of transistor 122. These steps are performed by the memory system of FIG. 1. After the programming causes the threshold voltage of transistor 122 to reach the target threshold, the memory system then moves on to program transistor 124 in the next programming time interval as illustrated in FIG. 4B. Thus, as shown in FIG. 4B, the high writing voltage is applied to the word line WL1 instead and the intermediate voltage $V_{PASS}$ is applied to the remaining word lines to program transistor 124 in the same manner described above for programming transistor 122. After transistor 124 has been programmed, the memory system then proceeds during the next programming time interval to program transistor 126 as illustrated in FIG. 4C where the high writing voltage is applied to word line WL2 and the intermediate voltage applied to the remaining word lines. After this is completed, the system proceeds to program transistor 128 as illustrated in FIG. 4D in the next programming time interval, and then to program transistor 130 during the following programming time interval. This process begins with the transistor closest to the source select transistor, and is then repeated sequentially and serially in the same order as the transistors are laid out between the source select transistor (e.g. transistor 50 in FIG. 3A) and the drain select transistor (e.g. transistor 40 in FIG. 3A), until all of the transistors in the string 100 have been programmed.

As discussed above in reference to FIG. 2B, the boosted channel voltage in transistor 122 may cause breakdown of the drain area of the source select transistor 120 during three of the four programming time intervals illustrated in FIGS. 4B–4D, so that hot electrons may be generated that are injected into the floating gate FG0, after the floating gate FG0 has already been programmed. This electron injection will cause the threshold voltage of FG0 to shift, which may result in switching FG0 from a desired charge storage state to a different erroneous charge storage state. The same can be said for other strings in the memory array. As discussed above in reference to FIG. 2B, the boosted channel voltage in transistor 122 may cause breakdown of the drain area of the source select transistor 120 during the four programming time intervals illustrated in FIGS. 4A–4D. As a result, program disturb may occur because of a reduced boosting potential in the channel area of the NAND string. This type of program disturb can occur on any of the word lines when the word line is being selected for programming, such as when $V_{PGM}$ is applied to that word line. Another possibility for program disturb, mentioned above as well, is due to hot electrons that may be generated in the vicinity of the drain of the source select transistor 120 or in the channel area of memory cell 122 and subsequently injected into the floating gate FG0. The latter mechanism will likely only affect the memory cells on WL0 since the hot electrons are localized and limited to a small area in the vicinity of the drain of the source select gate 120 or in the channel area of memory cell 122. This hot electron injection will cause the threshold voltage of FG0 to shift, which may result in switching FG0 from a desired charge storage state to a different erroneous charge storage state. The same can be said for other strings in the memory array.

Since the above-described breakdown phenomena persists when all of the cells are programmed, it is found that as successive word lines are being programmed, the threshold voltage distribution of cell 122 gradually worsens. After all word lines have been programmed, it is discovered that the threshold distribution has shifted up and has widened significantly. In some flash memories, the window of the charge level voltage range is divided into four states, where the raised state "11" has a negative threshold voltage range and the remaining three states "10", "00", and "01" have positive threshold voltage distributions in the ascending order. Where the conventional self boosting scheme is applied, after all of the memory cells have been programmed, where each cell can store any one of the four states, it is found that the "10" threshold voltage distribution has shifted to higher values and has widened significantly so that "10" can be read as a "00". The "00" threshold voltage distribution is also found to have been affected somewhat as well. By reducing the voltage applied to WL0, it is expected that the upshifting and broadening of the "10" charge state will be much reduced or eliminated all together.

One aspect of the invention is thus based on the recognition that such breakdown of the drain area of the source side select transistor can be alleviated or prevented altogether by applying electrical potentials to the word lines so that the above described program disturb mechanisms are suppressed, so that the boosting does not alter the charge state at FG0. In one implementation in the parent application, this can be achieved by reducing the voltage that is supplied to WL0 to a value below $V_{PASS}$, such as a voltage in the range of one to three volts instead of the five to ten volt intermediate voltage for $V_{PASS}$ normally applied during conventional self boosting. This is illustrated in FIGS. 5A–5D.

FIGS. 5A–5D are cross-sectional views of the NAND string 100 with biased voltages different from those applied during conventional self boosting to illustrate one aspect of the invention. When cell 122 is being programmed, the bias voltages applied are the same as those employed in the conventional self boosting scheme. However, during the subsequent programming time intervals where cells 124, 126 and 128 are programmed, instead of applying the traditional $V_{PASS}$ to word line WL0 in the typical eight to ten volt range, a lower voltage $V_{LOW}$ is applied instead to the word line WL0. As noted above, in one implementation, $V_{LOW}$ may be in the range of or one to three volts. Such low voltage will be applied to the word line WL0 during at least some and preferably all of the programming time intervals for programming all of the cells in the memory array, except during the programming time interval for cells under the word line WL0. By applying a low voltage to WL0, the boosted channel potential under WL1, WL2 and so forth cannot be fully transferred to the drain of the source select transistor. As a result, the drain voltage of the source select transistor is lower and the breakdown can be prevented or reduced in severity. For example, in the case of FIG. 5B, assume that all memory cells 122–130 are in the erased state with an erased threshold voltage of about –2V, the channel area under the memory cells 124–130 will be boosted to for example 8V (depending on the $V_{PASS}$ value). Assume furthermore that a voltage $V_{LOW}$ of 1.5V is applied to WL0, in combination with the –2V threshold voltage of memory cell 122, this means that the memory cell 122 is in the conducting state. As a result, a part of the boosted charge in the channel area of memory cell 124–130 will be transferred to the source side of memory cell 122; as a result, the potential on the source side will rise. However, the rise will stop after the source side potential of memory cell 122 has reached a value of about 3.5V (gate voltage–threshold voltage). As a result, the drain potential of the source side select transistor is only boosted up to a value of 3.5V while in the conventional case it would have been boosted to 8V. It is obvious that the very significant reduction in drain voltage will prevent or at least strongly reduce the breakdown at the select transistor drain. Band-to band tunneling is reduced by such scheme to an extent so that the charge state of cell 122 will not change by the self boosting voltages applied to the channel regions of transistors 122–130.

Figure 2A:
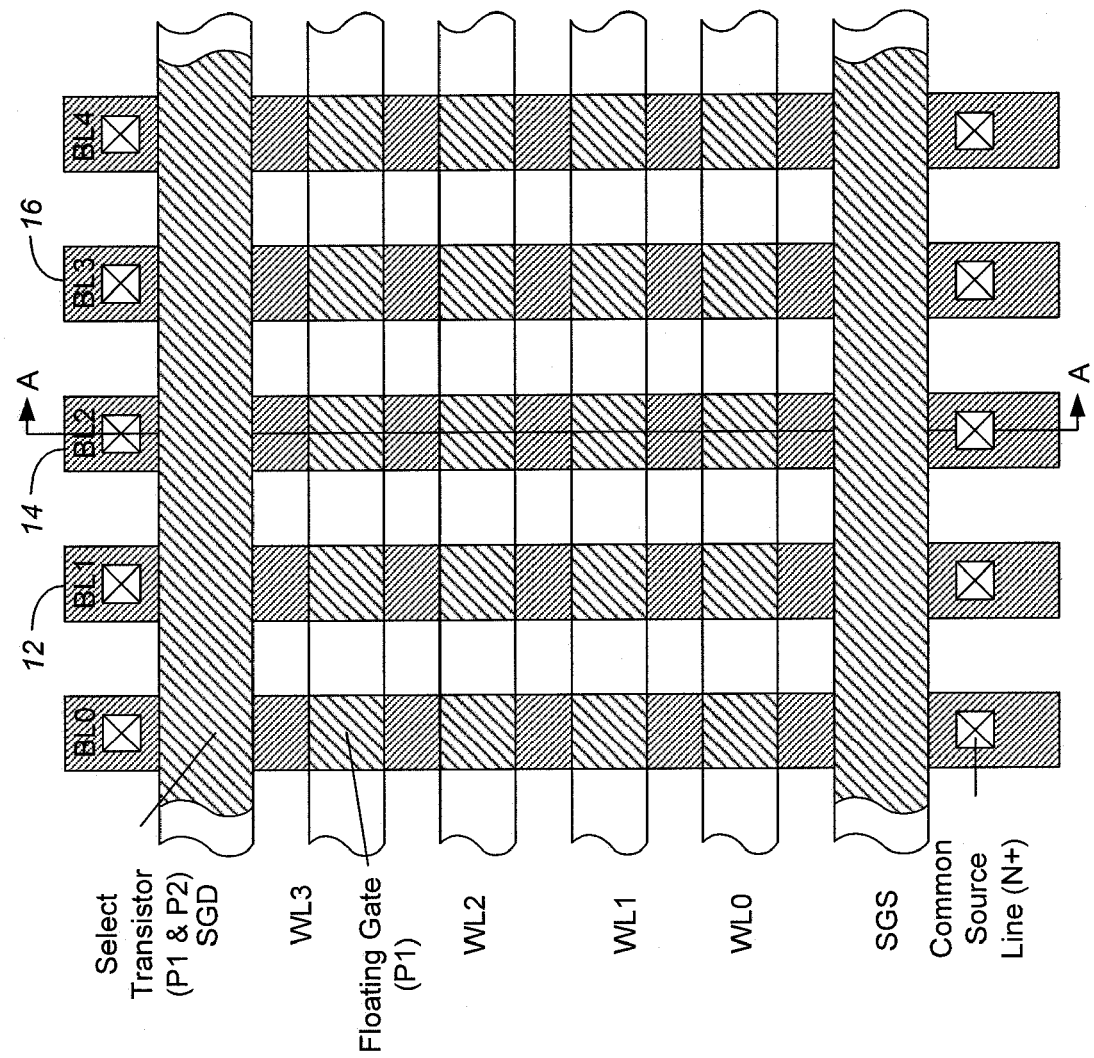
FIG. 2A is a plan view of a prior art NAND array.

The above-described breakdown can also occur at the source area of the transistor in a string next to the drain select transistor, such as transistor area 51 of drain select transistor 40 in FIG. 2B, even though the drain side select gate typically has a higher gate voltage, such as in the range of 1.5–2.5V during boosting, than the source side select gate which is typically at a 0V gate voltage during boosting. Drain select transistor breakdown at the source area is prevented by reducing the voltage applied to the transistor in a string next to the drain select transistor to a value lower than that normally used for boosting the channel voltage in a self boosting scheme to reduce or prevent program disturb. Thus, FIGS. 5A–5D need only be modified slightly to illustrate this. Instead of being the source select transistor, transistor 120 is instead the drain select transistor which has a higher gate voltage, such as in the range of 1.5–2.5V during boosting, than the source select transistor. The interpretation of the labeling of the word lines would also be revised so that WL0 is the word line closest to drain select transistor 120. The programming sequence then proceeds beginning with the transistor closest to the source select transistor towards the drain side of the strings, until the transistor (122) closest to the drain select transistor (120) is reached. Thus, FIG. 5D to FIG. 5A, in such order, illustrate the last few cycles of such programming sequence. Instead of applying zero volts to the word line WL0 coupled to transistor 122 (transistor next to the drain select transistor), a low positive voltage $V_{LOW}$ is applied. In one implementation, the voltage $V_{LOW}$ applied to the transistor 122 may be in the range of one to three volts. In another implementation, the boosting voltage coupled to some of the transistors other than the transistor 122 to prevent program disturb may be higher than that ($V_{LOW}$) coupled to the transistor 122 by at least 50%. The above-described features related to source and/or drain area breakdown of transistor(s) next to the drain and/or source select transistor(s) can be used in conjunction with any self boosting scheme, including but not limited to any form of SB, LSB and EASB.

The process illustrated in FIGS. 5A–5D preferably begins with the transistor closest to the source select transistor, and is then repeated sequentially and serially in the same order as the transistors are laid out between the source select transistor (e.g. transistor 50 in FIG. 3A) and the drain select transistor (e.g. transistor 40 in FIG. 3A), until all of the transistors in the string 100 have been programmed.

FIGS. 6A–6E are cross-sectional views of the NAND string 100 to illustrate a conventional EASB programming of respective cells in the string. As noted above, the EASB system applies zero volts to the word line on the source side of the selected word line during programming so that the two boosted channel areas of the lower word lines and upper word lines are isolated by the memory cell with zero volt on the word line. This causes such memory cell to be turned off, thereby isolating the two boosted channel areas. A result of separating the two channel areas is that the boosting efficiency of the drain side is improved. The channel area of the source side is boosted less because some of the memory cells on the source side can be in the programmed states and therefore have higher threshold voltages. The channel area of the drain side of the selected word line is (almost) fully pre-charged through the bit line and more efficiently boosted since all cells on the drain side are still in the erased states with negative threshold voltages. In reference to FIG. 6B, for example, when cell 124 is being programmed, zero volt is applied to WL0. When cell 126 is being programmed as illustrated as in FIG. 6C, zero volt is applied to WL1. When cell 128 is being programmed, zero volt is applied to WL2 and when cell 130 is being programmed, zero volt is applied to WL3 of string 100.

A disadvantage of conventional EASB is that leakage (and/or band-to-band tunneling) related breakdown may occur at the drain areas of the cells under the grounded word line. This breakdown may cause indirectly the injection of hot electrons into the floating gates of cells on the selected word line or a reduction of the boosted channel potential, similar to that described for the SB mechanism, thereby possibly causing program disturb. Furthermore, when memory cell dimensions of future generation devices become smaller, the channel length of the turned off memory cells may become too short to be able to isolate electrically the two separately boosted channel areas at the drain and source sides of the selected word line. Thus, another aspect of the invention is based on the recognition that by appropriately biasing two or more word lines (preferably ones adjacent to one another) or control gates on the source side of the selected transistor or word line to increase effectively the channel length of the isolation memory cells, band-to-band tunneling and/or leakage between the two boosted areas can be reduced simultaneously. Since the isolation in the improved EASB scheme occurs only on the source side of the selected memory cell or word line, there is typically no need to similarly reduce the voltage coupled to the cells on the drain side of the selected transistor. This aspect of the invention is illustrated in FIGS. 7A–7E. Although five floating gate memory cells are shown in each string in FIGS. 7A–7E, the individual strings typically include 16, 32 or more memory cell charge storage elements.

Figure 7A:
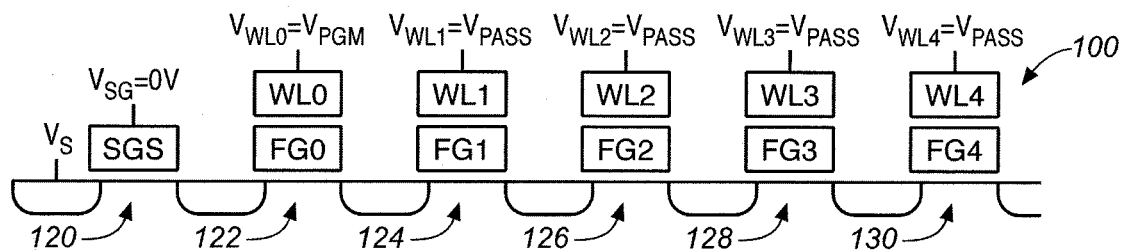
FIGS. 7A–7E are cross-sectional views of a NAND string showing the bias voltages in the string during five consecutive time intervals in a modified EASB programming scheme to illustrate another embodiment of the invention.
Figure 7B:
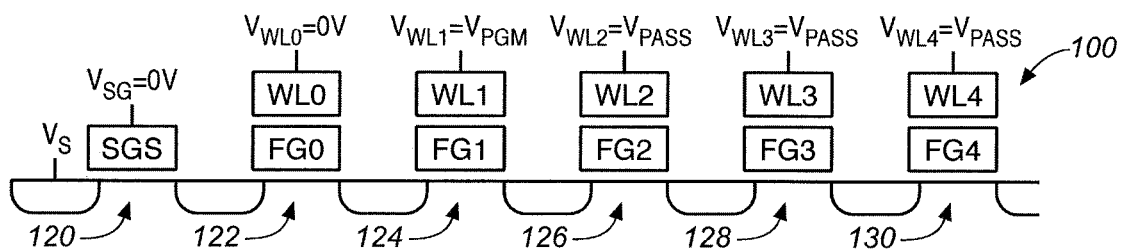
Figure 7C:
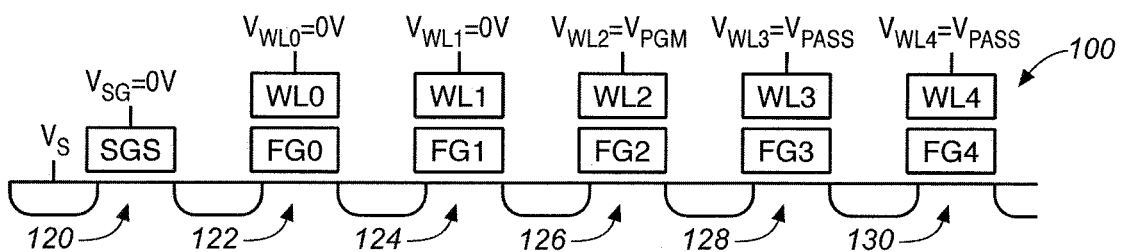
Figure 7D:
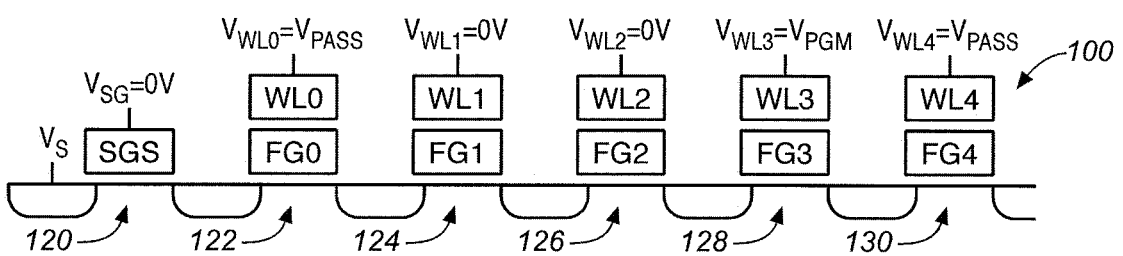
Figure 7E:
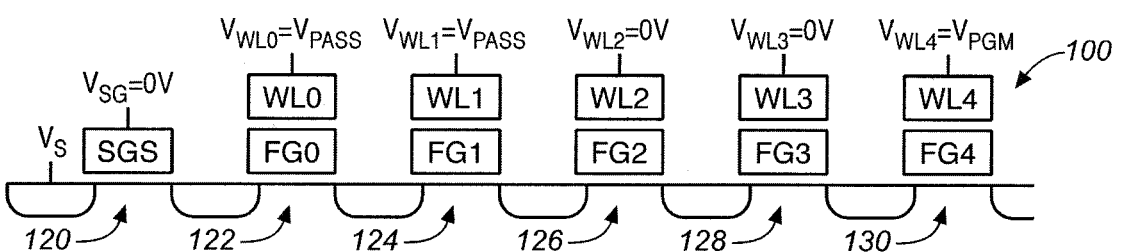

FIGS. 7A–7E are cross-sectional views of NAND string 100 showing the bias voltages applied to the string in a modified EASB scheme to illustrate this aspect of the invention in the parent application. The modified scheme of FIG. 7A–7E differs from that of FIGS. 6A–6E in that two word lines (preferably ones adjacent to each other) on the source side of the selected word line are grounded instead of only one word line as in the conventional EASB scheme. Thus, in FIGS. 7C–7E, for example, when the cells 126, 128, and 130 are being programmed in sequential programming time intervals, the two source side word lines immediately adjacent to the selected word line are grounded. Thus, in FIG. 7C when cell 126 is being programmed, zero volt is being applied to WL0 and WL1. In FIG. 7D, when the word line WL3 is selected for programming cell 128, zero volt is applied to WL1 and WL2. In FIG. 7E, when cell 130 is being programmed and WL4 is selected, zero volt is applied to WL2 and WL3.

Applying zero volt to two source side adjacent word lines has the effect of increasing the channel length of the isolation region. By increasing the channel length of the isolation region to that spanned by two adjacent cells, boosting of the drain side channel areas of the selected cell is improved, thereby also reducing program disturb. If desired, 0 volt may be applied to more than two adjacent word lines to further increase the length of the isolation region between the boosted channel areas. If desired, the grounded word line(s) can be separated from the selected word line by one or more word lines. Another advantage of biasing two or more word lines to 0V is that the worst case situation for leakage between the source and drain boosted channel regions is less likely to occur. The worst case situation occurs when the cell under the 0V word line is in the erased negative threshold voltage state; in that situation, some of the boosted drain side channel charge may still leak away since the memory cell is conducting (because of the negative threshold voltage) during a part of the boosting operation. When two word lines are connected to 0V, the probability that under both word lines a memory cell in the erased state is present is smaller than when only one word line is biased to 0V.

As in the process of FIGS. 4A–4D, the process in FIGS. 7A–7E preferably begins with the transistor closest to the source select transistor, and is then repeated sequentially and serially in the same order as the transistors are laid out between the source select transistor (e.g. transistor 50 in FIG. 3A) and the drain select transistor (e.g. transistor 40 in FIG. 3A), until all of the transistors in the string 100 have been programmed.

Breakdown due to leakage and/or band-to-band tunneling may still occur between the grounded cells and the cells being programmed, and between grounded cells and the cells to which an intermediate voltage $V_{PASS}$ has been applied. This is the case especially for memory cells with small channel lengths. Thus, breakdown can occur in the drain junction or in the vicinity of the drain junction between cells 126 and 128 in FIG. 7D and between cells 122 and 124 in the same figure. To reduce such breakdown, instead of grounding the two word lines on the source side of the selected word line, a low positive voltage may be applied instead. This has the effect of reducing the potential difference between the junction areas (memory cell drain and source) of the isolation cells 124 and 126 and the floating gate potential of memory cells 122 and 128 in FIG. 7D. A reduced potential difference between the floating gate and its corresponding highly boosted drain or source region reduces the likelihood that breakdown can occur. A small bias voltage in the order of one to three volts applied to the word lines WL1 and WL2 in FIG. 7D is likely sufficient to suppress the breakdown mechanism(s) such as leakage and/or band-to-band tunneling while adequate to isolate the two boosted regions in the EASB scheme. Such modified scheme is illustrated in FIGS. 8A–8E. From a comparison of the two sets of figures (FIG. 7A–7E; 8A–8E), it is noted that instead of grounding the two word lines immediately adjacent to and on the source side of the selected word line, as in FIGS. 7A–7E, low voltages $V_{LOW1}$ and $V_{LOW2}$ are applied instead as shown in FIGS. 8A–8E.

Figure 8A:
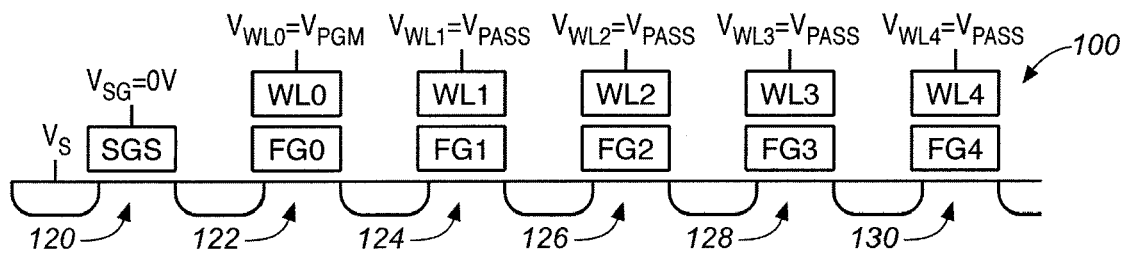
FIGS. 8A–8E are cross-sectional views of a NAND string showing the bias voltages in the string during five consecutive time intervals in a modified EASB programming scheme to illustrate yet another embodiment of the invention.
Figure 8B:
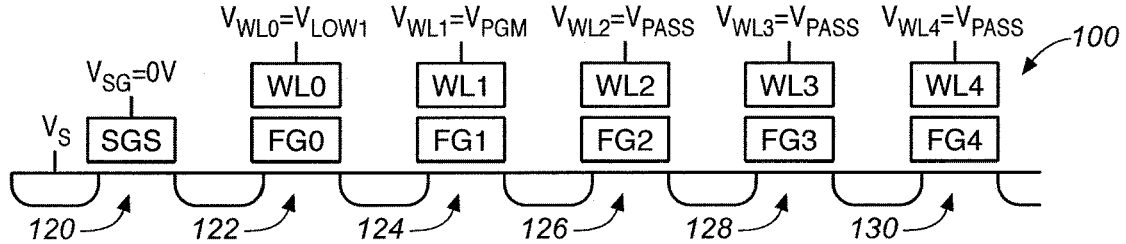
Figure 8C:
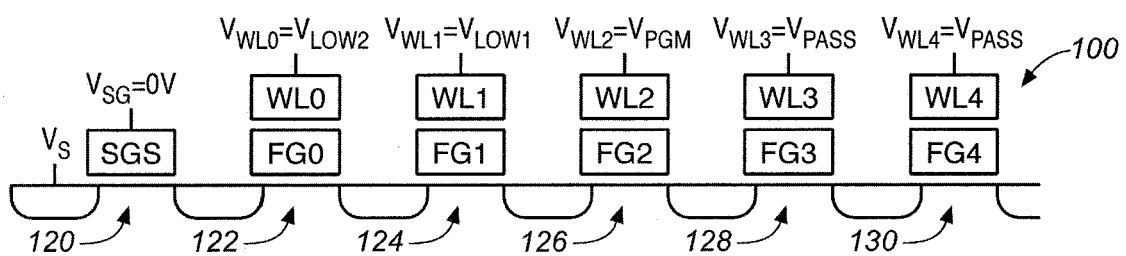
Figure 8D:
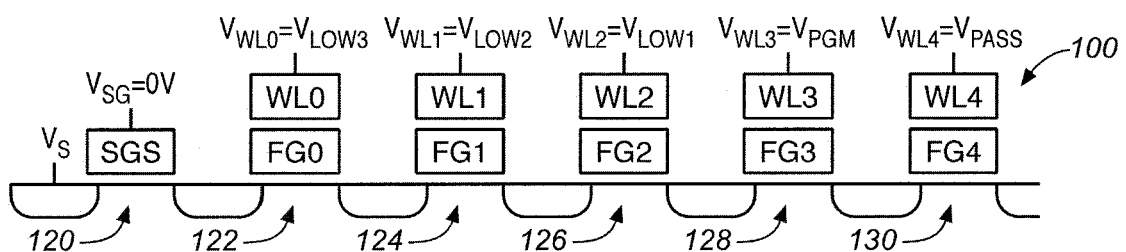
Figure 8E:
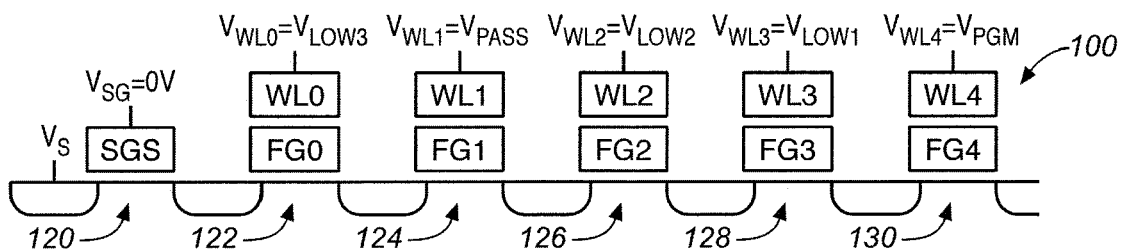

The embodiment of FIGS. 8A–8E also incorporates the aspect of the invention described above in reference to FIGS. 5A–5D. Instead of applying the intermediate voltage $V_{PASS}$ to WL0 as in FIGS. 7B–7E, a low voltage $V_{LOW3}$ is applied instead, as illustrated in FIGS. 8D and 8E. This will reduce or prevent the drain side breakdown of the source select transistor 120 that may affect the threshold voltage of FG0 under word line WL0. In the same vein, this aspect of the invention (applying a low voltage to WL0) may be combined with a LSB scheme. For such purpose, FIGS. 8A–8E may be modified slightly to apply a voltage (e.g. 0 volts) to the word line on the drain side of the selected word line as well to also isolate the unselected cells coupled to the selected word line from the channel regions of their neighboring cells on the drain side.

Set forth below is a table summarizing an overview of possible SB and EASB biasing schemes referring to FIGS. 8A–8E. It should be noted that the voltages $V_1$, $V_2$, and $V_3$ in the table below do not necessarily have to be different. Typical values for these three voltages could be around or one to three volts. While different variations are possible, a preferred configuration is where $V_{LOW1}$ and $V_{LOW3}$ are equal to $V_{dd}$ which is in a range of 1 to 3 volts and preferably of the order of 1.8 volts and the voltage $V_{LOW2}$ is around zero volts. Such configuration of voltages will suppress or prevent breakdown at both the select gate and the isolation word line and will isolate the two boosted channel areas efficiently since one of the two isolation word lines is grounded, thereby turning off the transistors coupled to the grounded word line. At such values, it is noted from FIG. 8E that the selected transistor (e.g. 130) is separated from the transistor (e.g. 126) coupled to the word line to which 0 volt is applied by at least another transistor (e.g. 128) in the same string of transistors where a low positive voltage rather than 0 volt is applied to such transistor (e.g. 128).

| Method | Description | $V_{LOW1}$ | $V_{LOW2}$ | $V_{LOW3}$ | Comments |
|---|---|---|---|---|---|
| 1 | SB | $V_{PASS}$ | $V_{PASS}$ | $V_{PASS}$ | Conventional SB |
| 2 | EASB | 0V | $V_{PASS}$ | $V_{PASS}$ | Conventional EASB (FIGS. 6A–6E) |
| 3 | Modified SB | $V_{PASS}$ | $V_{PASS}$ | $V_3$ | Reduces breakdown at source side select gate (FIGS. 5A–5D) |
| 4 | Modified EASB | 0V | 0V | $V_{PASS}$ | Improves isolation between the two boosted areas (FIGS. 7A–7E) |
| 5 | Modified EASB | $V_1$ | $V_{PASS}$ | $V_{PASS}$ | Reduces breakdown at the wordline next to the selected wordline |
| 6 | Modified EASB | $V_1$ | $V_2$ | $V_{PASS}$ | Reduces breakdown at the wordline next to the selected wordline and improves isolation of the two boosted areas |
| 7 | Modified EASB | $V_1$ | $V_{PASS}$ | $V_3$ | Reduces breakdown at the wordline next to the selected wordline and at the select gate |
| 8 | Modified EASB | $V_1$ | $V_2$ | $V_3$ | Reduces breakdown at the wordline next to the selected wordline, at the select gate and improves the isolation of the two boosted areas. (FIGS. 8A–8E) |

$V_1$ and $V_3$, are preferably in a range of about 1–3V, $V_2$ is preferred to be about 0V.

To illustrate yet another embodiment, the string 100 includes another cell or transistor (not shown) in the string on the drain side of transistor 130, where such transistor is coupled to another word line WL5 (not shown) on the drain side of WL4. In this embodiment, a programming voltage Vpgm is applied to the word line WL5, and voltages are applied to the remaining word lines so that they are at the following voltages: WL4=$V_1$=1.5V, WL3=$V_2$=0V, WL2=$V_1$=1.5V, WL1=Vpass, WL0=$V_3$=1.5V. This would prevent breakdown at both sides of the word line WL3 to which 0 volt is applied. In more general terms, low voltages may be applied to three adjacent word lines, where the voltage (such as 0 volt) applied to the center one of the three word lines causes a programmed transistor coupled to it to be turned off.

A scheme analogous to the above EASB scheme can also be used for LSB. A disadvantage of conventional LSB is that breakdown may occur between the channel areas coupled to the selected word line and the drain and source areas of the cells under the grounded word line on the source side of the selected word line. This breakdown may cause indirectly the injection of hot electrons into the floating gates of cells on the selected word line and/or a reduction of the boosted channel potential, thereby possibly altering the threshold voltages of such cells which is undesirable. In the case when memory cell dimensions of future generation devices become smaller, the channel length of the turned off memory cells may become too short to be able to isolate electrically the channel area coupled to the selected word line from the channel areas at the drain and source sides of the selected word line; as a result, boosted charge can leak away and the boosted potential will be reduced, possibly resulting in program disturb. Thus, another aspect of the invention is based on the recognition that, by appropriately biasing two or more word lines (preferably ones adjacent to one another) on the source side and appropriately biasing two or more word lines (preferably ones adjacent to one another) on the drain side of the selected transistor or word line to increase effectively the channel length of the isolation memory cells, both band-to-band tunneling and leakage between the three boosted areas is thereby reduced simultaneously. This aspect of the invention is illustrated in FIGS. 9A–9E.

Figure 9A:
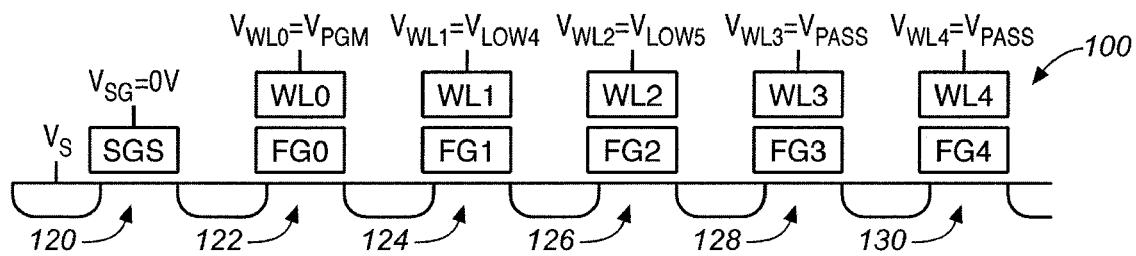
FIGS. 9A–9E are cross-sectional views of a NAND string showing the bias voltages in the string during five consecutive time intervals in a modified LSB programming scheme to illustrate yet another embodiment of the invention.
Figure 9B:
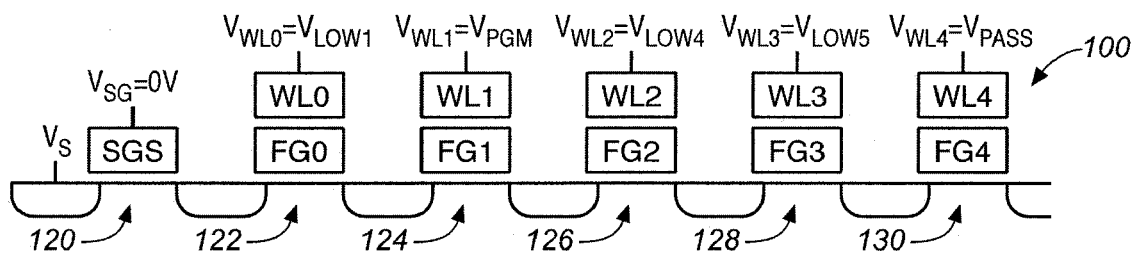
Figure 9C:
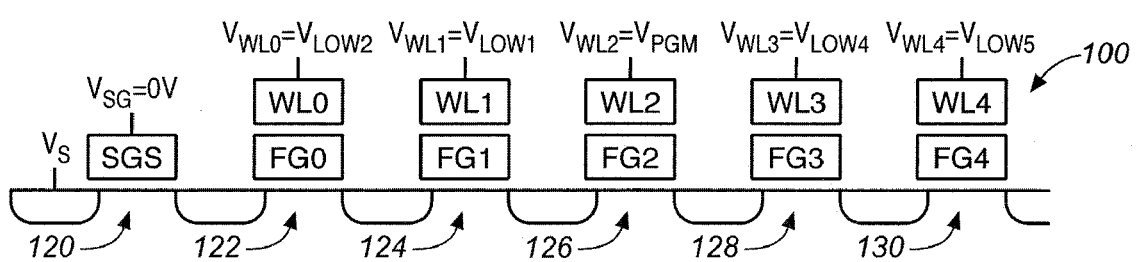
Figure 9D:
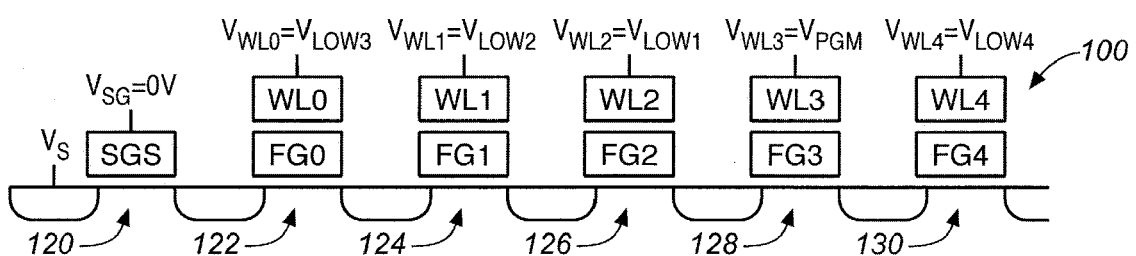
Figure 9E:
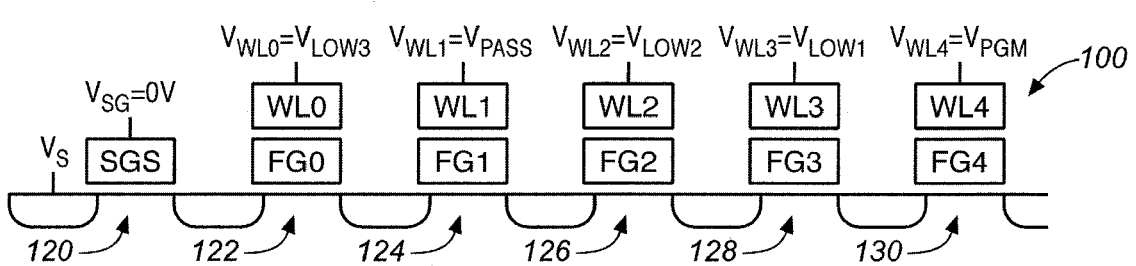
Figure 10A:
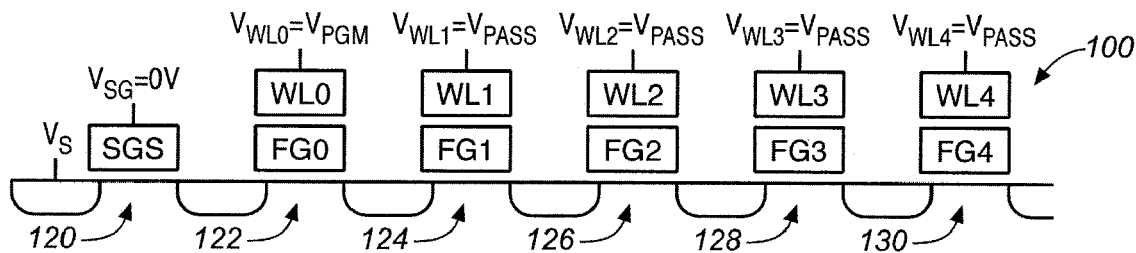
FIGS. 10A–10D are cross-sectional views of a NAND string showing the bias voltages in the string during four consecutive time intervals in an improved self-boosting programming scheme useful to illustrate another embodiment of the invention.
Figure 10B:
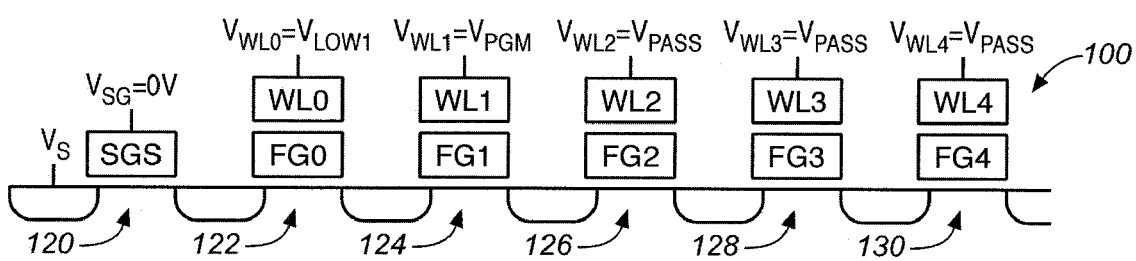
Figure 10C:
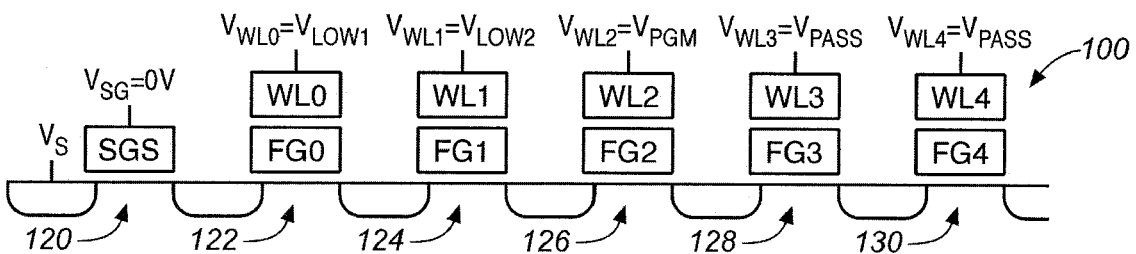
Figure 10D:
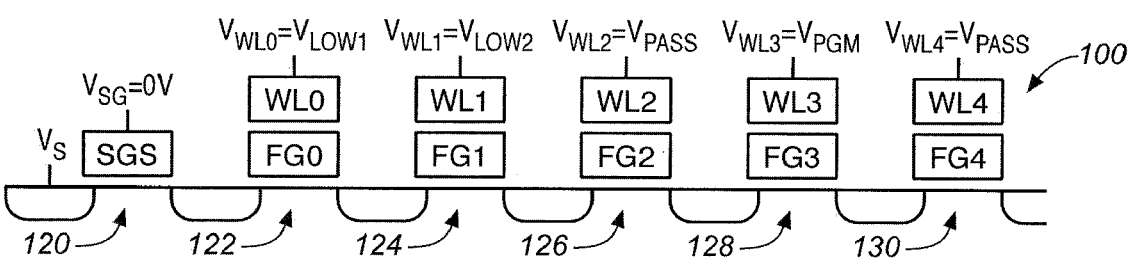

FIGS. 9A–9E are cross-sectional views of NAND string 100 showing the bias voltages applied to the string in a modified LSB scheme to illustrate this aspect of the invention. The modified scheme of FIG. 9A–9E differs from that of FIGS. 8A–8E in that zero or low positive voltage levels $V_{LOW4}$, $V_{LOW5}$ are applied to the two word lines (preferably ones adjacent to each other) on the drain side of the selected word line in addition to those on the source side of the selected word line. Thus, in FIGS. 9A–9C, for example, when the cells 122, 124, and 126 are being programmed in sequential programming time intervals, zero or low positive voltage levels are applied to the two drain side word lines immediately adjacent to the selected word line. Thus, in FIG. 9A when cell 122 is being programmed, zero volt or low positive voltage levels $V_{LOW4}$, $V_{LOW5}$ are applied to WL1 and WL2. In FIG. 9B, when the word line WL1 is selected for programming cell 124, zero volt or low positive voltage levels $V_{LOW4}$, $V_{LOW5}$ are applied to WL2 and WL3. In FIG. 9C, when cell 126 is being programmed and WL2 is selected, zero volt or low positive voltage levels $V_{LOW4}$, $V_{LOW5}$ are applied to WL3 and WL4.

Applying zero volt to two source side adjacent word lines has the effect of increasing the channel length of the isolation region. By increasing the channel length of the isolation region to that spanned by two or more adjacent cells on each side of the selected word line, boosting of the channel areas of the unselected cells coupled to the selected word line is improved, thereby also reducing program disturb. If desired, zero volt or low positive voltage levels may be applied to more than two adjacent word lines to further increase the length of the isolation region between the boosted channel areas. If desired, the grounded word line(s) can be separated from the selected word line by one or more word lines.

As in the process of FIGS. 4A–4D, the programming process in FIGS. 9A–9E preferably begins with the transistor closest to the source select transistor, and is then repeated sequentially and serially in the same order as the transistors are laid out between the source select transistor (e.g. transistor 50 in FIG. 3A) and the drain select transistor (e.g. transistor 40 in FIG. 3A), until all of the transistors in the string 100 have been programmed. Under such programming scheme, zero volt applied to the word line (e.g. WL1 or WL2 in FIG. 9A) on the drain side adjacent to the selected word line (e.g. WL0 in FIG. 9A) will not turn off the transistor (e.g. 124 or 126 in FIG. 9A) in the same string as the selected transistor (e.g. 122 in FIG. 9A) and coupled to such word line (e.g. WL1 or WL2 in FIG. 9A), since such transistor is still in the erased state and has a negative threshold voltage. As a result, complete isolation is not possible but is expected to be better than with only one transistor biased at 0V. For the same reason, the preferred voltage for $V_{LOW4}$ and $V_{LOW5}$ is 0V since that will optimize the isolation while there is no danger of band-to-band tunneling in the case of cells that are in the erased state since the potential difference between the floating gate and the boosted drain/source areas is less for erased cells than for programmed cells. A coupling voltage of zero volt, however, will turn off completely a programmed transistor with a positive threshold voltage in the same string as the selected transistor.

Breakdown may still occur at the drain or source side of the grounded cells directly next to the selected word line that is connected to $V_{PGM}$, and at the drain or source side of the grounded cells and the cells to which an intermediate voltage $V_{PASS}$ has been applied. Thus, breakdown can occur at the source side of cell 124 in FIG. 9A and at the drain side of cell 126 in the same figure. To reduce such breakdown, instead of grounding the two word lines on the drain side of the selected word line, a low positive voltage may be applied instead. This has the effect of reducing the potential difference between the floating gate of memory cell 124 and its highly boosted source side and reducing the potential difference between the floating gate of memory cell 126 and its boosted drain side that is boosted by WL3, WL4 and so forth with a voltage $V_{PASS}$ in FIG. 9A. However, as in general with the LSB method, the cells at the drain side of the selected cell are still in the erased state (negative threshold voltage), so it may not be necessary to apply a low positive voltage to reduce band-to-band tunneling since band-to-band tunneling mainly occurs at the drain or source side of memory cells that are in the highest programmed state (threshold voltage of about 2.5–3V). Note however, that in some programming schemes, intermediate data (e.g. data corresponding to a threshold voltage between the highest programmed state and the erased state) may be present in the transistors on the word line at the drain side next to the selected word line. In such case, a sufficiently high voltage is connected to that word line to guarantee that the bit line voltage(s) used during programming operations can be transferred to the channel area of the selected transistor(s) on the selected word line. Besides preventing breakdown at the source side of cell 124 and the drain side of cell 126, a low positive voltage connected to the two word lines on the drain side of the selected word line can reduce the channel boosting of transistors under the selected word line in strings to be inhibited. Since in this case the drain side boosted channel area and the boosted area under the selected word line of transistor strings to be inhibited are connected to each other during the initial part of the ramp up of the Vpass voltage (before reaching the final Vpass level), some charge sharing between the two boosted regions will occur until the channel areas are boosted to a sufficiently high level to turn off at least one of the two transistors controlled by the two word lines on the drain side of the selected word line. As a result of the charge sharing during the ramp-up of Vpass, the channel area under the selected word line of transistor strings to be inhibited will be boosted less and thus the breakdown at the drain side of transistors such as transistor 126 in FIG. 9D can be reduced/prevented. Thus by choosing a proper voltage on the word lines at the drain side of the selected word line, the amount of isolation between the drain side boosted channel area and the boosted channel area under the selected word line can be adjusted and chosen in such a way that both boosting under the selected word line is sufficient while preventing/reducing breakdown at the drain side of the transistor(s) located at the source side of the selected word line. Thus, in case a low voltage such as 0V is applied to those word lines, the two boosted regions are isolated from each other while in case a voltage similar to Vpass is applied both channels are connected, voltages in between 0V and Vpass can be used to adjust the amount of isolation between the two boosted regions.

While different variations are possible in FIGS. 9A–9E, one preferred configuration is where $V_{LOW1}$ and $V_{LOW3}$ are all equal to $V_{dd}$ which is in a range of 1 to 3 volts and the voltages $V_{LOW2}$, $V_{LOW4}$ and $V_{LOW5}$ are around zero volts. Such configuration of voltages will suppress or prevent breakdown at both the select gate and the isolation word lines and will isolate the channel areas coupled to the selected word line efficiently since one of the two isolation word lines on the source side and at least one and in the preferred case both of the two isolation word lines on the drain side are grounded, thereby turning off the transistors coupled to the grounded word lines. At such values, it is noted from FIG. 9C that the selected transistor (e.g. 126) is separated from the transistors (e.g. 122 and 130) coupled to the word lines to which 0 volt is applied by at least another transistor (e.g. 124 and 128) in the same string of transistors, and small positive voltage(s) is/are applied to such separation transistors (e.g. 124 and 128), although it would be preferable to apply 0 volt to memory cell 128. Another preferred configuration is where $V_{LOW1}$ and $V_{LOW3}$ are equal to $V_{dd}$ in a range of 1 to 3 volts and $V_{LOW2}$ around zero volt while $V_{LOW4}$ and $V_{LOW5}$ are connected to another low voltage between 0 volt and Vpass (typically in a range of 3–6 volts) to adjust the amount of isolation between the boosted channel areas as described above in the previous paragraph.

In some situations, it may be desirable to be able to raise slightly the voltage of the channel region of the selected transistor during the programming process. One example of the situations where such capability is desirable is described in U.S. patent application U.S. 2003/0147278, which is incorporated herein by reference. To make this possible, it may be desirable to allow a low positive voltage (e.g. 0.5 volt) on the bit line for the selected string to be communicated to the channel region of the selected transistor through the channel regions of the cells on the drain side of the selected word line. The LSB scheme described above in reference to FIGS. 9A–9E may be modified slightly for such purpose. Instead of setting $V_{LOW4}$ and $V_{LOW5}$ to about 0 volts, preferably they may be set to low positive voltages such as those in a range of 1 to 3 volts and preferably of the order of 1.8 volts. Another possibility is to set only one of them to about 0 volts, with the remaining one at a low positive voltage such as one in a range of 1 to 3 volts and preferably of the order of 1.8 volts. In such event, in order to reduce or avoid breakdown, preferably $V_{LOW4}$ is set to such low positive voltage, and $V_{LOW5}$ is set to about 0 volts. Alternatively, $V_{LOW4}$ is set to such low positive voltage, and $V_{LOW5}$ is a higher voltage, such as $V_{PASS}$, which is typically of the order of five to ten volts.

In the embodiment described above in reference to FIGS. 5A–5D, a reduced (relative to $V_{PASS}$) voltage $V_{LOW}$ is coupled to transistor 122, unless transistor 122 is being programmed. Program disturb may be further reduced when a reduced voltage is coupled not only to the transistor adjacent or next to the drain or source select transistor, such as transistor 122, but also to one or more additional charge storage transistors next to or adjacent to such transistor, such as transistor 124. This is illustrated in FIGS. 10A–10D. For some applications, it may be desirable to apply the reduced voltage to transistors 126 and/or 128 and/or . . . , in addition to transistors 122 and/or 124. All such variations are within the scope of the invention. The values of the reduced voltage may take on the values described above for other embodiments, such as 1–3 or 1–6 volts. Preferably the voltage coupled to transistor 122 is lower than that or those coupled to other transistors, such as transistor 124, 126, 128, ... etc. Thus in FIGS. 10A–10D, it is preferable for $V_{LOW1}$ to be lower than $V_{LOW2}$ with typical values for $V_{LOW1}$ being in a range of 1–3 volt while a typical range for $V_{LOW2}$ would be from 3–6 volt. Aside from such difference, the scheme of FIGS. 10A–10D is similar to that of FIGS. 5A–5D. Thus, $V_{PASS}$ may be in the range of 5–10 volts. The aspect of the invention illustrated in FIGS. 10A–10D may be combined with other features described herein, in a manner parallel to how the feature of FIGS. 5A–5D is combined with such features described above.

The self-boosting scheme of FIGS. 4A–4D can also be improved by coupling different boosting voltages, instead of the same voltage $V_{PASS}$, to the transistors in the transistor string to be inhibited. This is illustrated in FIGS. 11A–11D, where the boosting voltage $V_{PASS2}$ coupled to the transistor adjacent to and on the bit line side of the transistor programmed is different from the boosting voltage $V_{PASS1}$ coupled to the remaining transistors in the same string. For example, the voltage (e.g. $V_{PASS2}$) coupled to a transistor (e.g. 128 in FIG. 11C) next or adjacent to the selected word line (e.g. WL2 in FIG. 11C) is different from that or those coupled to other transistors (e.g. 122, 124, 130 in FIG. 11C). $V_{PASS2}$ is preferably lower than $V_{PASS1}$, in such a case, program disturb on the word line next to the selected word line can be reduced. The scheme of FIGS. 11A–11D is then repeated sequentially and serially in the same order as the transistors are laid out between the source select transistor (e.g. transistor 50 in FIG. 3A) and the drain select transistor (e.g. transistor 40 in FIG. 3A), until all of the transistors in the string 100 have been programmed.

Figure 11A:
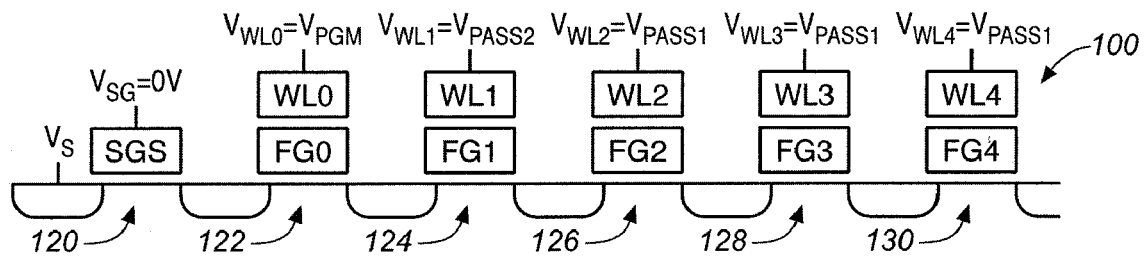
FIGS. 11A–11D are cross-sectional views of a NAND string showing the bias voltages in the string during four consecutive time intervals in an improved self-boosting programming scheme useful to illustrate another embodiment of the invention, where the bias voltages include different boosting voltages for boosting the transistor channel voltage.
Figure 11B:
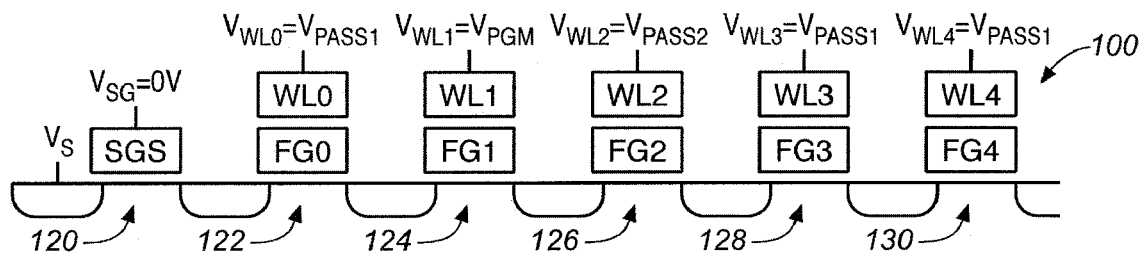
Figure 11C:
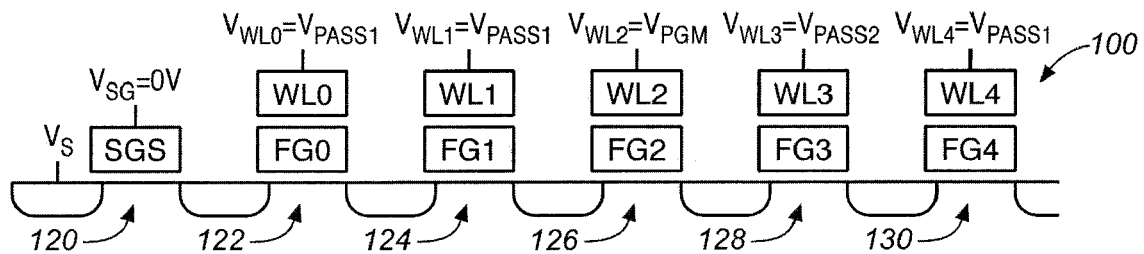
Figure 11D:
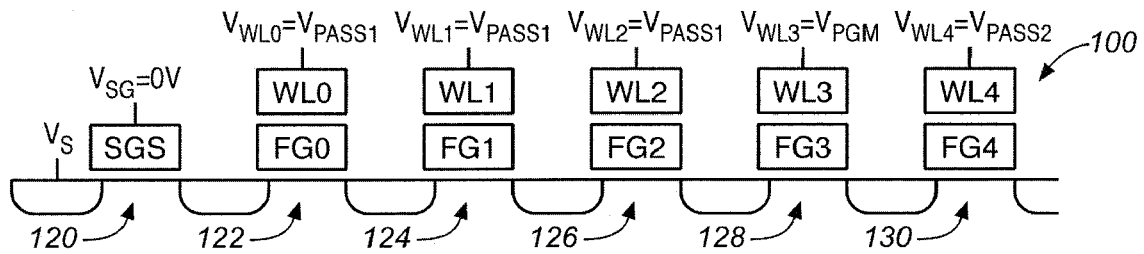

It is also possible to couple $V_{PASS2}$ also to a transistor next or adjacent to and on the source side of the selected word line (e.g. to transistor 124, not as shown in FIG. 11C), in addition to coupling $V_{PASS2}$ to transistor 128 as shown in FIG. 11C. The lower than $V_{PASS1}$ voltages coupled to such two transistors (e.g. 124 and 128 of FIG. 11C) also can be different from one another, such as where a voltage different from $V_{PASS2}$ and lower than $V_{PASS1}$ is coupled to transistor 124. Where the self boosting scheme (e.g. any one of he EASB schemes above) is such that a lower voltage is applied to the word line adjacent to and on the source side of the selected word line, it may not be necessary to apply $V_{PASS2}$ instead to such word line. All such variations are within the scope of the invention.

The reason for using a lower Vpass on those word lines adjacent to the selected word line is that there is a parasitic capacitive coupling between the selected word line and its adjacent word lines. When the high voltage Vpgm is applied to the selected word line WLn, the word line voltage on the word line WLn+1, which is the adjacent word line on the bit line side (and WLn−1 as well in some embodiments), will rise due to the capacitive coupling; where the amount of rise strongly depends on the RC delay of the word lines, the rise time of the Vpgm pulse and the amount of coupling between the word lines. After Vpgm has finished ramping up, the voltage on the neighboring word line(s) will go back to its initial (Vpass) value. This temporary rise in the word line voltage on WLn−1 and WLn+1 can cause increased program disturb on these two word lines in the case that the NAND string is selected for programming (0V on the bitline), since tunneling of electrons from the 0V channel to the floating gates of the memory cells associated with WLn−1 and WLn+1 is more likely to occur (higher WL voltage, higher floating gate voltage, higher (leakage) current from 0V channel to floating gate). This type of program disturb can be reduced/suppressed by applying a lower Vpass voltage on those word lines.

This aspect of the invention may be combined with those described above. For example, when combined with the scheme in FIGS. 5B–5D, $V_{LOW}$ and not $V_{PASS}$ will continue to be coupled to transistor 122. When combined with the scheme in FIGS. 7B–7E or 8A–8E, 0 volts, or $V_{LOW1}$, $V_{LOW2}$, $V_{LOW3}$ will continue to be coupled to the transistors as shown in these figures. With such exceptions, the scheme can be applied to the transistors to which $V_{PASS}$ is coupled in these figures.

While the invention has been described above by reference to various embodiments, it will be understood that changes and modifications may be made without departing from the scope of the invention, which is to be defined only by the appended claims and their equivalent. All references referred to herein are incorporated herein by reference.

What is claimed is:

1. A method for programming a memory system, said system comprising strings of charge storage transistors for storing different charge states, each of said strings including two select transistors, each of said strings connected between one of a plurality of bit lines and a source line, said strings controlled by a common set of word lines, wherein a first charge storage transistor is in a first string of the strings and adjacent to one of the two select transistors in the first string, said method comprising:

applying a program voltage level through one of the word lines to a control gate that is capacitively coupled with a second charge storage transistor in a second string of the strings different from the first string to program the second transistor, said second transistor separated from the source line by three or more charge storage transistors in said second string when charge storage transistors closer to the source line than the bit line connected to the second string are programmed or separated from the bit line that is connected to the second string by three or more charge storage transistors in said second string when charge storage transistors closer to such bit line than the source line are programmed, said control gate controlling also to a third charge storage transistor in the first string;

coupling first voltage(s) to the first transistor and to one or more additional charge storage transistors that is or are different from the select transistors in the first string and adjacent to the first transistor;

turning off at least a fourth charge storage transistor in the first string between the source line and the third transistor, in order to electrically isolate the third transistor from transistors in the first string between the source line and the fourth transistor; and boosting, through some of the word lines, electrical potential(s) of channel regions of the first string of transistors by coupling boosting second voltage(s) to at least some of the remaining transistors in the first string, the second voltage(s) being higher than the first voltage(s), to boost said electrical potential(s) of channel regions of the first string of transistors to a value or values closer to the program voltage, thereby reducing program disturb.

2. The method of claim 1, wherein the first voltage(s) coupled to said one or more additional charge storage transistors is/are higher than the voltage coupled to the first transistor.

3. The method of claim 1, wherein the first voltage(s) coupled to said one or more additional charge storage transistors is/are in a range of about 1 to 6 volts.

4. The method of claim 1, the boosting second voltage(s) being higher than the first voltage(s) by at least 50% of the first voltage(s).

5. The method of claim 1, wherein said first voltage(s) is/are in a range of about 1 to 3 volts.

6. The method of claim 5, wherein the first voltage(s) coupled to said one or more additional charge storage transistors is/are in a range of about 3 to 6 volts.

7. The method of claim 1, wherein said second voltage(s) is/are in a range of about 5 to 10 volts.

8. The method of claim 1, further comprising coupling a third voltage to the one select transistor in the first string to cause it to be electrically non-conducting, and wherein the first voltage(s) is/are higher than the third voltage.

9. The method of claim 1, further comprising turning off at least a fifth charge storage transistor in the first string between the bit line connected to the first string and the third transistor, in order to electrically isolate the third transistor from transistors in the first string between such bit line and the fifth transistor.

10. The method of claim 9, wherein each of the fourth and fifth transistors are separated from the third transistor by at least one transistor in the first string.

11. The method of claim 1, wherein the fourth transistor is separated from the third transistor by at least one transistor in the first string.

12. A method for programming a memory system, said system comprising strings of charge storage transistors for storing different charge states, said strings including a first string, each of the strings including two select transistors, said strings controlled by a common set of word lines and connected between a plurality of bit lines and a source line, wherein a first charge storage transistor is in the first string and adjacent to one of the two select transistors, said method comprising:
applying a program voltage level to a first control gate that is capacitively coupled with a second charge storage transistor, and subsequently applying a program voltage level to a second control gate that is capacitively coupled with a third charge storage transistor different from the second transistor to program the second and third transistors, each of said second and third transistors being in a second string of the strings different from the first string and being separated from the source line by one or more charge storage transistors in said second string when charge storage transistors closer to the source line than the bit line connected to the second string are programmed or separated from the bit line that is connected to the second string by one or more charge storage transistors in said second string when charge storage transistors closer to such bit line than the source line are programmed; and
coupling first voltage level(s) to the first transistor and to one or more additional charge storage transistors in the first string and adjacent to the first transistor; and
boosting, through some of the word lines, electrical potential(s) of channel regions of the first string of transistors by coupling boosting second voltage level(s) to at least some of the remaining transistors in the first string, the second voltage level(s) being higher than the first voltage level(s), when a program voltage level is applied to the control gates coupled to the second and third transistors, to boost said electrical potential(s) of channel regions of the first string of transistors to a value or values closer to the program voltage, thereby reducing program disturb, wherein the first or second control gate also controls a fourth charge storage transistor in the first string, said method further comprising turning off at least a fifth charge storage transistor in the first string between the source line and the fourth transistor, in order to electrically isolate the fourth transistor from charge storage transistors in the first string between the source line and the fifth transistor.

13. The method of claim 12, said method comprising a plurality of programming time intervals to program all the transistors in the second string, wherein during each of said plurality of programming time intervals a program voltage level is coupled to one of the transistors in said second string to program such transistor, and the first voltage level(s) coupled to the first transistor and the one or more additional transistors is/are different from that/those coupled to other transistors in the first string during two or more of said plurality of programming time intervals.

14. The method of claim 12, wherein the electrical potential(s) of the channel regions of the first string are/is boosted so that breakdown at the drain or source side of the one select transistor is reduced to such an extent that it does not result in a change of the first transistor charge storage state to a different charge state.

15. The method of claim 14, wherein the electrical potential(s) of the channel regions of the first string are/is boosted so that said band-to-band tunneling at the drain or source side of the one select transistor is suppressed.

16. The method of claim 14, wherein the desired charge storage state is one of more than two possible charge storage states of the first transistor, and said coupling the first voltage level(s) to the first transistor and to the one or more additional transistors does not result in a change of the first transistor's desired charge storage state to a different one of the more than two possible charge states.

17. The method of claim 12, the second voltage level(s) being higher than the first voltage level(s) by at least 50% of the first voltage level(s).

18. The method of claim 17, wherein said first voltage level(s) is/are in a range of about 1 to 3 volts.

19. The method of claim 18, wherein the first voltage(s) coupled to said one or more additional charge storage transistors is/are in a range of about 3 to 6 volts.

20. The method of claim 17, wherein said second voltage level(s) are/is in a range of about 5 to 10 volts.

21. The method of claim 12, further comprising coupling a third voltage level to the one select transistor in the first string to cause it to be electrically non-conducting, and wherein the first voltage level(s) is/are higher than the third voltage.

22. The method of claim 12, wherein the fifth transistor is separated from the fourth transistor by at least one transistor in the first string.

23. The method of claim 12, further comprising turning off at least a sixth charge storage transistor in the first string between the bit line connected to the first string and the fourth transistor, in order to electrically isolate the fourth transistor from charge storage transistors in the first string between such bit line and the sixth transistor.

24. The method of claim 23, wherein each of the fifth and sixth transistors are separated from the fourth transistor by at least one charge storage transistor in the first string.

25. The method of claim 12, wherein the voltage(s) coupled to said one or more additional charge storage transistors is/are higher than the voltage coupled to the first transistor.

26. The method of claim 13, wherein the first voltage(s) coupled to said one or more additional charge storage transistors is/are in a range of about 1 to 6 volts.

27. A method for programming a memory system, said system comprising strings of charge storage transistors for storing different charge states, said strings including a first and a second string each connected between one of a plurality of bit lines and a source line and controlled by common word lines, each of said strings including a source select transistor connected to the source line, said method comprising:

applying a program voltage to a selected word line coupled to a selected charge storage transistor in the first string to program the selected transistor;

coupling by means of said common word lines first or second boosting voltages to at least some of the transistors in the second string to boost electrical potential(s) of channel regions of transistors in the second string to a value or values closer to the program voltage to reduce program disturb, wherein the first boosting voltage is coupled to a first charge storage transistor in the second string adjacent to the selected word line, and the second boosting voltage(s) is/are coupled to the remaining transistors in the second string except for the transistors coupled to the selected word line, the first boosting voltage being different from the second boosting voltage(s).

28. The method of claim 27, wherein the first boosting voltage is lower than the second boosting voltage(s).

29. The method of claim 27, wherein the applying applies the program voltage sequentially to a plurality of said common word lines to successively program selected transistors in the first string in sequential programming cycles, and wherein the first boosting voltage is lower than the second boosting voltage(s) during at least some of said programming cycles.

30. The method of claim 27, wherein the applying applies the program voltage to a first word line, and said first boosting voltage is applied to the common word line adjacent to the first word line and between the first word line and the bit line connected to the second string.

31. A method for programming a memory system, said system comprising strings of charge storage transistors for storing different charge states, said strings including a first and a second string each connected between one of a plurality of bit lines and a source line and controlled by common word lines, each of said strings including a source select transistor connected to the source line, said method comprising:

applying a program voltage to a selected word line coupled to a selected charge storage transistor in the first string to program the selected transistor;

coupling by means of said common word lines first or second boosting voltages to at least some of the transistors in the second string to boost electrical potential(s) of channel regions of transistors in the second string to a value or values closer to the program voltage to reduce program disturb, wherein different first boosting voltages are coupled to two charge storage transistors, one on each side and adjacent to the selected word line, and the second boosting voltage(s) is/are coupled to at least some of the remaining transistors in the second string, the first boosting voltage being different from the second boosting voltage(s).

32. The method of claim 27, further comprising coupling, through one or more of said common word lines, positive voltage(s) to one or more transistors in the first string between the selected transistor and a first one of the bit lines and to one or more transistors in the second string between the selected word line and a second one of the bit lines, so that a voltage on the first bit line is transferred to the channel area of the selected transistor, and so that boosting of channel voltage of a transistor in the second string coupled to the selected word line caused by the applying is reduced, to reduce or prevent breakdown at the drain side of a transistor in the second string between the selected word line and the source line.

33. The method of claim 32, wherein said positive voltage is in a range between about 0 volts and the first or second boosting voltages.

34. The method of claim 27, wherein said coupling is performed when said program voltage level is applied.

35. The method of claim 31, wherein said coupling couples the second boosting voltage(s) to all of the remaining transistors in the second string between said selected word line and the bit line.

36. The method of claim 31, wherein the first boosting voltages are lower than the second boosting voltage(s).

37. The method of claim 31, wherein said coupling is performed when said program voltage level is applied.

* * * * *

UNITED STATES PATENT AND TRADEMARK OFFICE
CERTIFICATE OF CORRECTION

| | |
|---|---|
| PATENT NO. | : 7,466,590 B2 |
| APPLICATION NO. | : 11/321955 |
| DATED | : December 16, 2008 |
| INVENTOR(S) | : Gerrit Jan Hemink, Hironobu Nakao and Shih-Chung Lee |

It is certified that error appears in the above-identified patent and that said Letters Patent is hereby corrected as shown below:

Column 24, line 61, claim 26; after "claim", delete "13" and insert --12--.

Signed and Sealed this

Nineteenth Day of May, 2009

JOHN DOLL
*Acting Director of the United States Patent and Trademark Office*